United States Patent [19]
Yoshitomi et al.

[11] Patent Number: 5,766,965
[45] Date of Patent: Jun. 16, 1998

[54] SEMICONDUCTOR DEVICE AND METHOD OF MANUFACTURING THE SAME

[76] Inventors: Takashi Yoshitomi, 3, Toshiba-Dai-1-Matsuba-So, 256-6, Sanmai-cho, Kanagawa-ku, Yokohama-shi, Kanagawa-ken; Masanobu Saito, 29-10, Inagedai-machi, Inage-ku, Chiba-shi, Chiba-ken; Hisayo Momose, 503, Heim Yamauchi, 1-20-2, Tamagawa, Ota-ku, Tokyo-to; Hiroshi Iwai, A-910, Park City Mizonokuchi, 3-6-1-910, Hisamoto, Takatsu-ku, Kawasaki-shi, Kanagawa-ken; Yukihiro Ushiku, 3-16-6, Kita-terao, Tsurumi-ku, Yokohama-shi, Kanagawa-ken; Mizuki Ono, 803-2-7-901, Mamedo-cho, Kohoku-ku, Yokohama-shi, Kanagawa-ken; Yasushi Akasaka, 803, Shinkoyasu Diamond Mansion, 3-393, Koyasu-dori, Kanagawa-ku, Yokohama-shi, Kanagawa-ken; Hideaki Nii, Toshiba-Isogo-Dai-1-Ryo, 3-7, Shiomidai, Isogo-ku, Yokohama-shi, Kanagawa-ken; Satoshi Matsuda, Toshiba-Isogo-Dai-3-Ryo, Shiomidai, Isogo-ku, Yokohama-shi, Kanagawa-ken; Yasuhiro Katsumata, 812-5-101, Hamanogo, Chigasaki-shi, Kanagawa-ken, all of Japan

[21] Appl. No.: 353,301

[22] Filed: Dec. 5, 1994

Related U.S. Application Data

[63] Continuation of Ser. No. 68,529, May 28, 1993, Pat. No. 5,434,440.

[30] Foreign Application Priority Data

May 29, 1992 [JP] Japan .................................. 4-139335
Dec. 11, 1992 [JP] Japan .................................. 4-352324

[51] Int. Cl.⁶ .................................................. H01L 21/265
[52] U.S. Cl. .................. 437/34; 437/44; 437/57; 437/160; 437/164
[58] Field of Search .................... 437/44, 160, 164, 437/34, 57

[56] References Cited

U.S. PATENT DOCUMENTS

| 4,356,623 | 11/1982 | Hunter | 437/44 |
| 5,001,082 | 3/1991 | Goodwin-Johansson | 437/200 |
| 5,024,959 | 6/1991 | Pfiester | 437/34 |
| 5,061,649 | 10/1991 | Takenouchi | 437/44 |
| 5,443,994 | 8/1995 | Solheim | 437/164 |

FOREIGN PATENT DOCUMENTS

| 60-134469 | 7/1985 | Japan . |
| 61-43477 | 3/1986 | Japan . |
| 61-154172 | 7/1986 | Japan . |
| 61-156858 | 7/1986 | Japan . |
| 64-46974 | 2/1991 | Japan . |

OTHER PUBLICATIONS

Wolf, "Silicon Processing for the VLSI Era vol. 2: Process Integration", Latice Press, pp. 354–361, 1990.

Primary Examiner—John Niebling
Assistant Examiner—Richard A. Booth

[57] ABSTRACT

A diffused layer serves as a source and a drain. It is formed comprised of a deep first diffused layer and a shallow second diffused layer positioned between the first diffused layer and the channel region. In the second diffused region, a distribution in a depth direction of carriers has a profile in which the concentration is more than $5 \times 10^{18}$ cm$^{-3}$ at the peak and is in correspondence with a carrier concentration of the semiconductor substrate at a depth less than 0.04 μm. Since the second diffused layer has a high concentration, the short-channel effect can be suppressed. As the second diffused region, a solid phase diffusion source such as an impurity doped silicate glass is used.

8 Claims, 34 Drawing Sheets

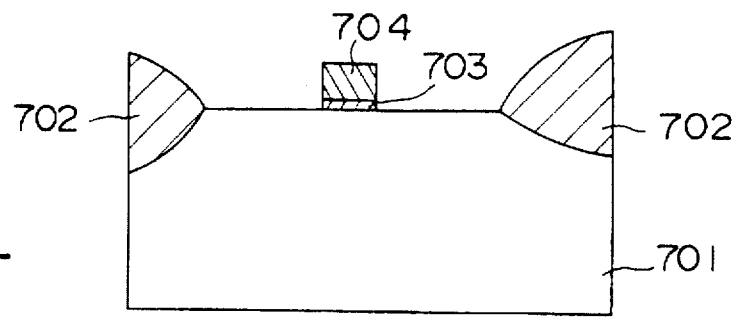
FIG. IA
PRIOR ART
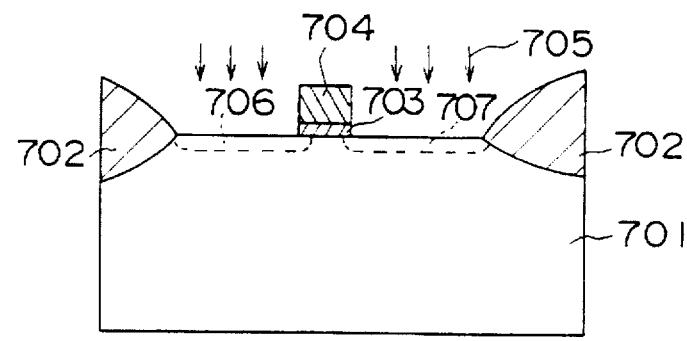
FIG. IB
PRIOR ART
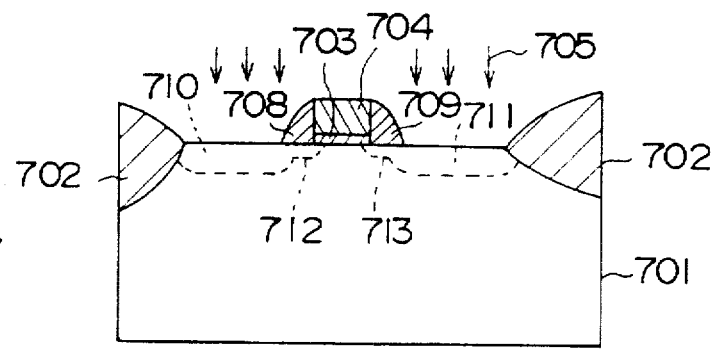
FIG. IC
PRIOR ART
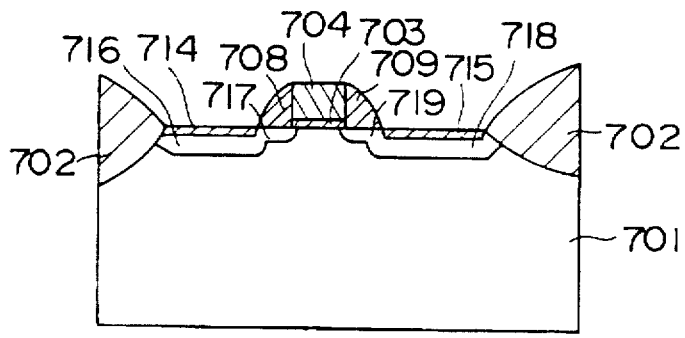
FIG. ID
PRIOR ART

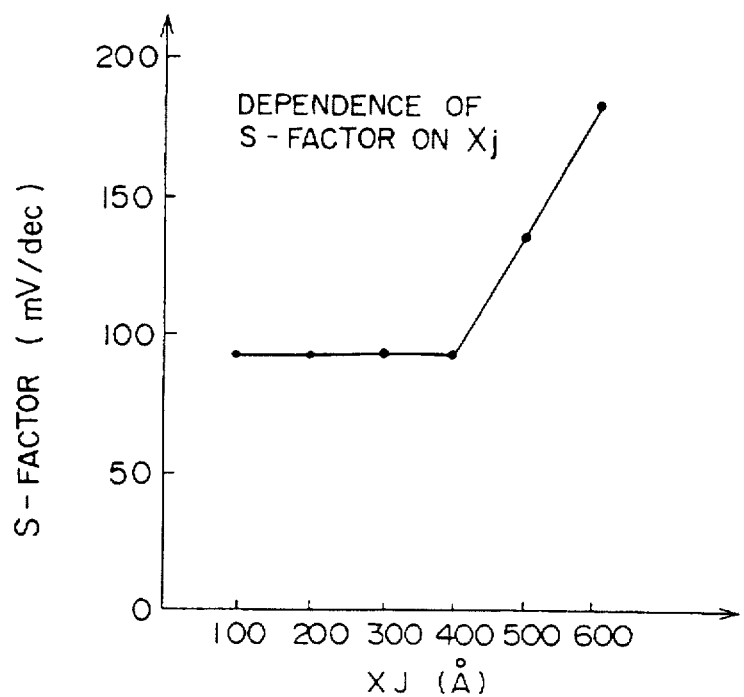
F I G. 6
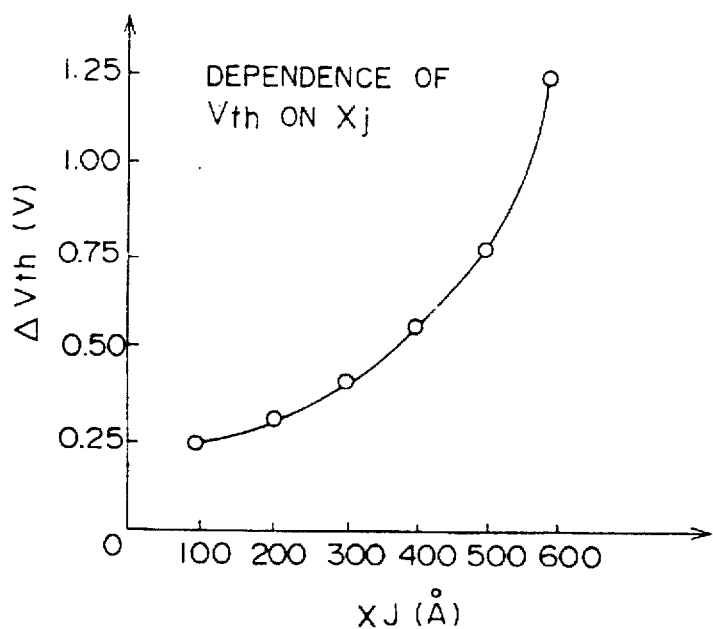
F I G. 7

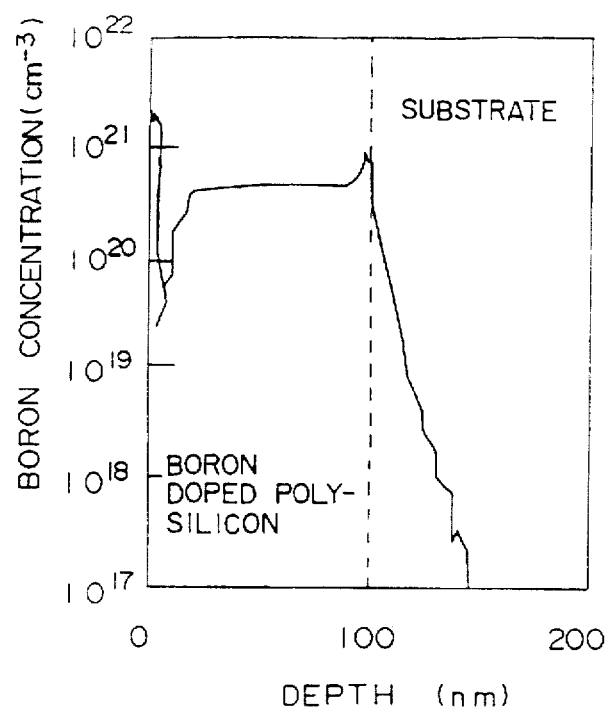
F I G. 9
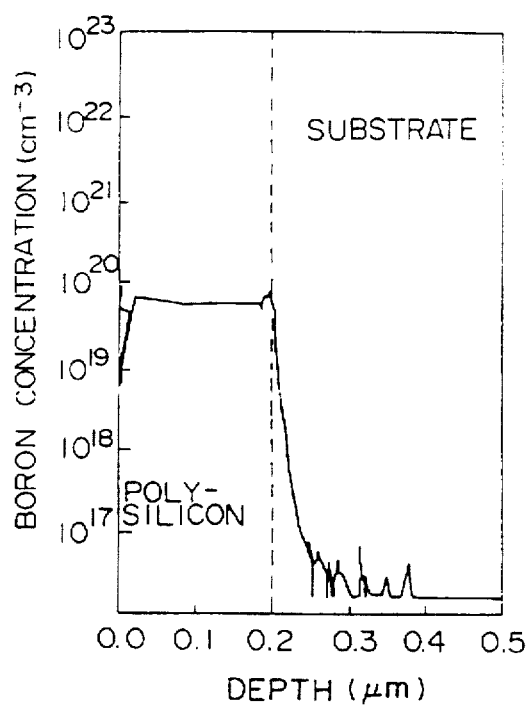
F I G. 10

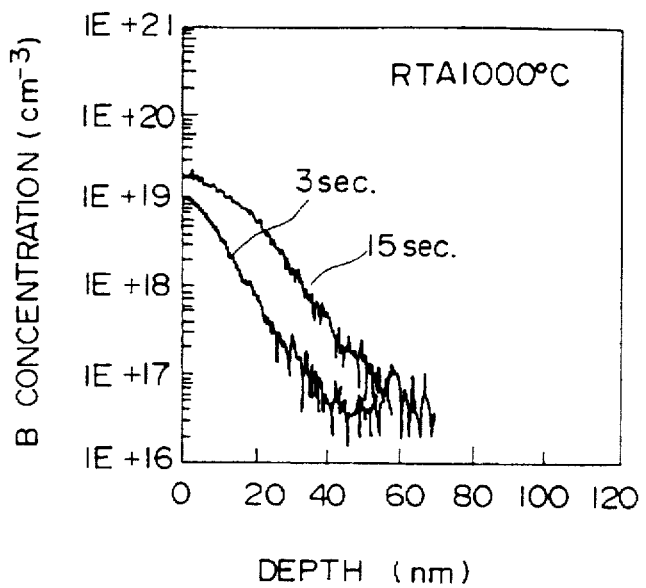
F I G. 15A
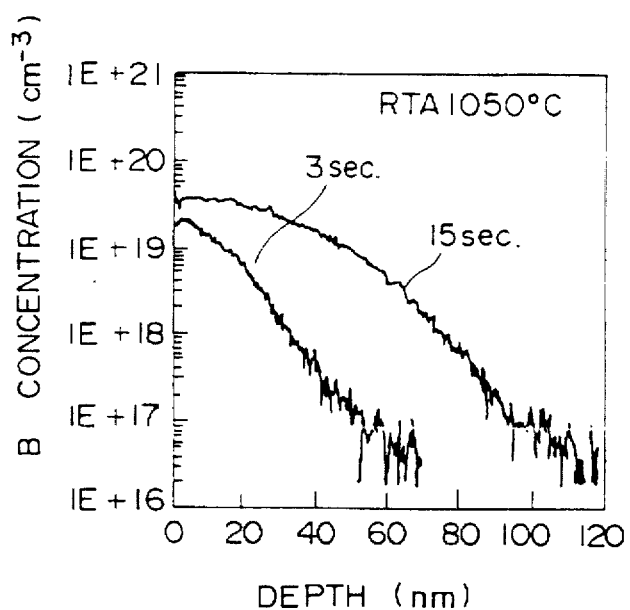
F I G. 15B

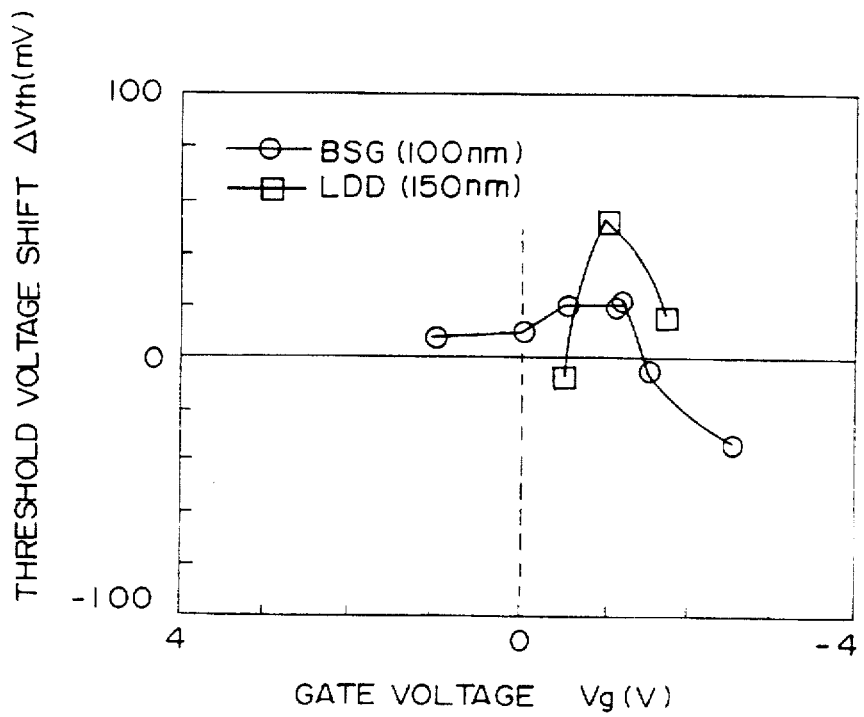
F I G. 26
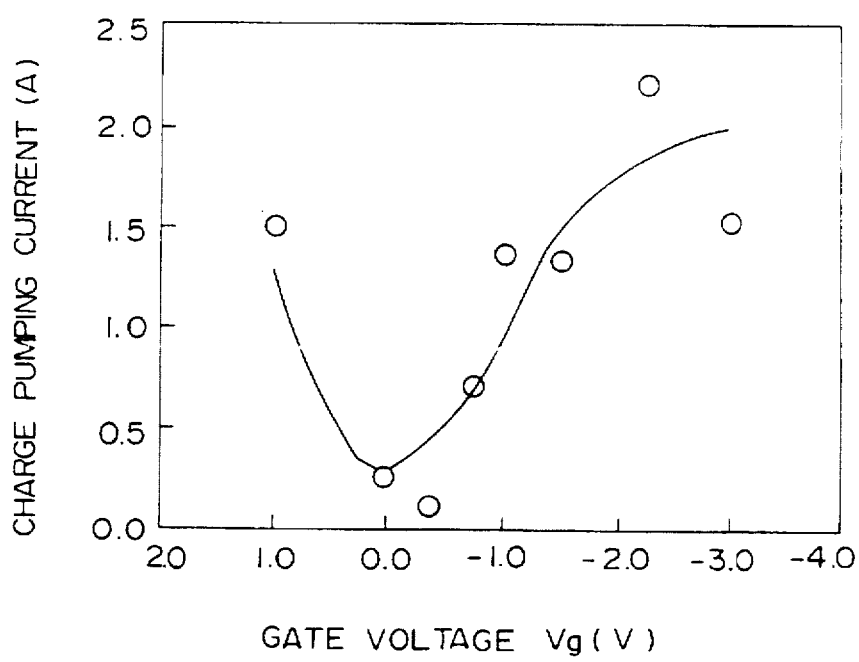
F I G. 27

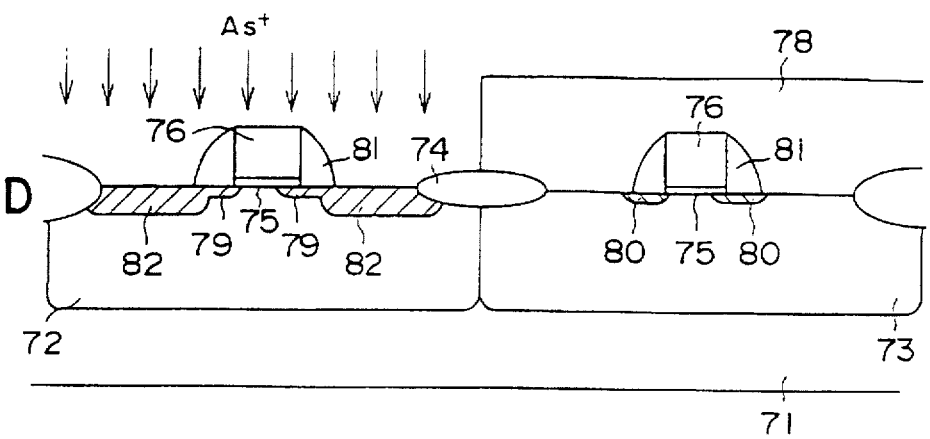
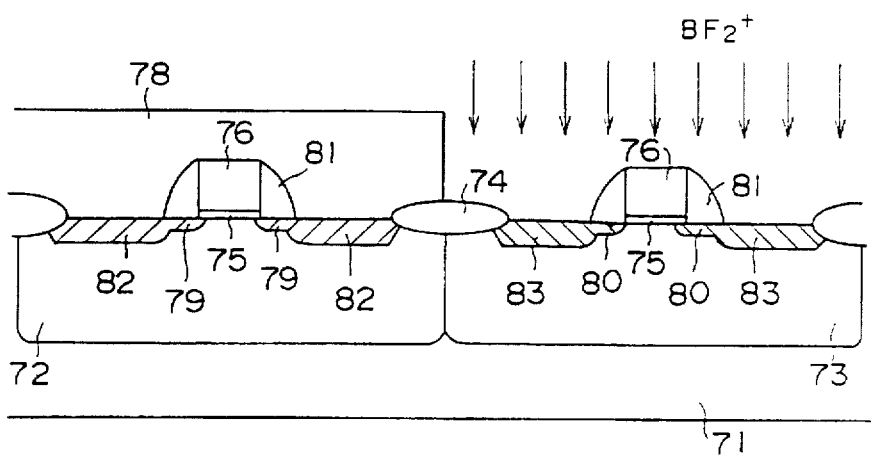
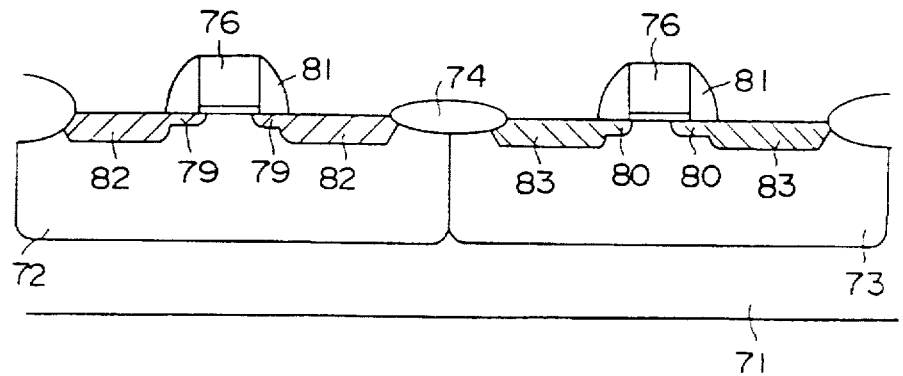

SEMICONDUCTOR DEVICE AND METHOD OF MANUFACTURING THE SAME

This application is a continuation of application Ser. No. 08/068,529, filed May 28, 1993, now U.S. Pat. No. 5,434,440.

BACKGROUND OF THE INVENTION

1. Field of the Invention

This invention relates to a semiconductor device advantageous for miniaturization.

2. Description of the Prior Art

There occurs the problem that, with development of miniaturization of the MISFET (Metal Insulation Silicon Field Effect Transistor), punch-through is apt to take place between the drain and source by the short-channel effect. With a view to solving this problem, a LDD (lightly doped drain) structure has been conventionally devised. Namely, this LDD structure is a structure having a lightly doped drain-source. When attention is drawn to, e.g., an n-channel MOSFET, the field oxide film sides of the drain region and the source region are caused to be an $n^+$ layer. The channel formation layer sides thereof are caused to be an $n^-$ layer, to set the impurity concentration at the channel side end portions of the drain and the source to a relatively lower value and thereby relax the drain electric field. This improves the withstand voltage, and prevents punch-through (penetration) between the drain and the source by the short-channel effect.

FIGS. 1A–1D show particularly a method of forming diffused layers serving as source and drain regions of in a typical manufacturing process for a MOSFET having such a LDD structure and its LDD elemental device structure.

In these figures, ion implantation for forming wells is first implemented into a silicon substrate 701 thereafter to carry out extending diffusion of the implanted impurity, to thereby form a well to subsequently carry out an ion implantation for prevention of a parasitic channel. Thereafter, selective oxidation is implemented onto the substrate 701 surface to form field oxide film 702 to carry out isolation of the elemental device region (hereinafter simply referred to as the device region) from each other. Then, a gate electrode material oxide film is formed by thermal oxidation on the entire surface of the region surrounded by the oxide film 702 on the substrate 701 to subsequently form a gate electrode material polycrystalline silicon (hereinafter polysilicon) film on the entire surface of the oxide film by using the LPCVD process so that its thickness reaches 2,000 angstroms. Thereafter, a mask of photoresist is formed on the polysilicon film serving as a gate electrode material by the optical lithography to implement patterning to the gate electrode material oxide film and the gate electrode material polysilicon film by using the RIE process thus to form a gate electrode comprised of a gate oxide film 703 and a polysilicon film 704 (FIG. 1A).

In the case where the MOSFET to be manufactured is a p-channel MOSFET, implantation of ions 705 of impurity $BF_2^+$ is then carried out using a low dose (about $1\times10^{13}$ $cm^{-2}$) and an acceleration voltage of about 30 KeV (FIG. 1B). In the figure, reference numeral 706 represents a low concentration ion implanted region which is to serve as a source formed by that ion implantation, and reference numeral 707 represents a low concentration ion implanted region which is to serve as a drain formed by that ion implantation.

Thereafter, a silicon oxide film is deposited on the entire surface of substrate 701 by the LPCVD process, so that its thickness reaches about 1000 angstroms to subsequently carry out the RIE process, thereby allowing oxide film portions 708, 709 formed in a side wall to be left on the side surfaces of the gate electrode. Further, the implantation of ions 705 of impurity $BF_2^+$ is, in turn, carried out ordinarily under the condition of a higher dose more than $1\times10^{15}$ $cm^{-2}$ and an acceleration voltage of about 30 KeV (FIG. 1C). Thus, a high concentration ion implanted region 710 is formed at the portion which is to serve as the source on the substrate 701, and a high concentration ion implanted region 711 is formed at the portion which is to serve as the drain on the substrate 701.

Then, the RTA (Rapid Thermal Annealing) process is carried out for 20 seconds at 1000° C. Then, after the activation of ion implanted impurity has been conducted, metal silicide films 714, 715 are formed on the surface portions of the respective ion implanted regions 710, 711 by the salicide (Self Align Silicide) process to thereby carry out activation of impurity to form the source region comprised of a high concentration diffused layer 716 and a low concentration diffused layer 717 and the drain region comprised of a high concentration diffused layer 718 and a low concentration diffused layer 719. Thus, LDD structures (low concentration diffused layers 717, 719) shallow in depth which have a low carrier concentration in correspondence with a carrier concentration of the substrate 701 are formed on the both sides of the channel formation region below the gate oxide film 703 (FIG. 1D).

Meanwhile, although such LDD structure has an advantage of suppression of the short-channel effect as previously described, it has the problem that since the channel side portions of the drain and source have a low concentration, the resistance between the source and the drain increases by lowering of the concentration, resulting in a lowered current drivability. For this reason, in the case where the short-channel effect is not so great a problem in relation to the power supply voltage specification, there were instances where such a LDD structure is not employed.

However, it is considered that the action of suppression of the short-channel effect by the LDD structure is very useful for miniaturization of a MOSFET. In view of this, the present inventors conducted a simulation to study an optimum mode (structure, impurity profile, etc.) of this LDD structure. As a result, it is found that from the points of view of both suppression of the short-channel effect and assuring drivability, the construction, in which a shallow diffused layer having high concentration which cannot be realized by optimizing the conventional method and a diffused layer required to have a certain depth when the salicide process, is taken into consideration.

SUMMARY OF THE INVENTION

With the above in view, an object of this invention is to provide a semiconductor device constituting a MOSFET of a novel structure which can both satisfy the two requirements of suppression of the short-channel effect and assuring of a drivability.

Another object of the present invention is to provide a method for manufacturing the MOSFET having the novel structure.

In accordance with the present invention, the source and the drain each have a first diffused layer including an impurity of a second conductivity type positioned on the field oxide film side and a second diffused layer including an impurity of the second conductivity type positioned on the channel formation region side in such a manner that they are relative to each other. The second diffused layers on the both sides of the gate are formed shallow so as to have high concentration as described above, thereby making it possible to reduce the parasitic resistance while suppressing the short-channel effect in a miniaturized MOSFET. Accordingly, a large drain current can be obtained. In addition, in carrying out formation of the electrode by the salicide process into the first diffused layer, a setting can be made such that the first diffused layer has a low contact resistance and is deep enough to permit a leakage current to be suppressed.

A first method for obtaining such a structure is characterized by ion-implanting an impurity under the condition of a high dose of more than $1\times10^{15}$ cm$^{-2}$ to cause only a region shallower than an impurity profile from the substrate surface to be in an amorphous state to, thereby, form a shallow and high concentration diffused layer by making use of the fact that, between the region caused to be in an amorphous region and the region which is not caused to be in an amorphous region, a difference of the activation rate therebetween takes place in the temperature region from 500° C. to 750° C.

A second method is characterized by forming insulating side walls of the gate electrode by silicate glass such as BSG, etc. with respect to the p-channel MOS and by silicate glass, such as AsSG, PSG, etc., with respect to the n-channel MOS to implement a high temperature and short time heat process by using the RTA process to thereby carry out solid phase diffusion from the side walls to form a diffused layer shallower than a diffused layer by ion implantation and RTA.

In this method, by controlling the side wall width, the width of a shallow diffused layer region can be controlled. Further, as the result of the fact that the side wall serves as a mask with respect to ion implantation, in a manner such that ion implantation is used in combination, a shallow diffused layer and a relatively deep diffused layer can be formed by the same heat treatment.

Further, a third method is characterized by forming a gate oxide film and a gate electrode on the substrate thereafter to deposit a BSG film with respect to the p-channel MOS and an AsSG film or a PSG film with respect to the n-channel MOS on the entire surface to thereby utilize the fact that the film thickness in a direction corresponding to an ion moving direction at the time of ion implantation is caused to be thick in the vicinity of the gate. Namely, when ion implantation of an impurity is carried out on this film, only the portion in the vicinity of the gate is masked by large film thickness, with the result that no impurity ion is implanted. At the same time, in a region separated to some extent from the gate, impurity ions are implanted in a manner to be shallower than that in the case where impurity ions are uniformly and directly implanted into the substrate. Thereafter, activation by the RTA process is carried out, whereby impurity ions are implanted shallow by the solid phase diffusion. As a result, in the region apart to some extent from the gate, a diffused layer is formed by implanted ions. In this instance, the structure by this method is characterized in that the diffused layer is shallow in the vicinity of the gate.

Furthermore, a fourth method is characterized by allowing silicon to be epitaxially grown on the exposed region where no gate electrode is formed within the region surrounded by the device isolation region on the semiconductor device to implant impurity ions into the epitaxially grown film thereafter to carry out annealing by the RTA process, etc. to thereby form a first diffused layer having a depth sufficient to suppress a leakage current by diffusion from the epitaxially grown film, and form at the same time a second diffused layer having a shallow depth sufficient to avoid the short-channel effect by diffusion from the insulating film side wall.

In the method of manufacturing a semiconductor device of the this invention, the diffused layer of the N-channel MOSFET is formed by diffusion from any one of AsSG, PSG and BPSG, and the diffused layer of the P-channel MOSFET is formed by diffusion from either BSG or BPSG. Accordingly, it is possible to form a diffused layer having a higher carrier concentration and shallower in depth as compared to a MOSFET according to the conventional method. Therefore, a high performance miniaturized MOSFET in which the short-channel effect is controlled can be provided.

In accordance with a further method of this invention, it becomes unnecessary to form a film serving as a diffusion source of the solid-phase diffusion with respect to respective N/P-channel transistors. As a result, a single solid phase diffusion source can be used. Thus, the number of process steps can be reduced to much a large degree.

Generally, in the ion implantation technology, it is difficult to form a shallow diffused layer having a high carrier concentration of the P-channel MOSFET. However, such source/drain diffused layers can be formed by the solid phase diffusion process without increasing the number of process steps too much.

In a still further method of this invention, since the source/drain diffused layers are formed by the solid phase diffusion, channeling which becomes problem in the ion implantation and/or speed increasing diffusion resulting from the implantation damage, does not take place. Thus, shallow source/drain diffused layers having a high concentration can be formed.

As a result, the suppressive effect with respect to the short-channel effect is increased, and the parasitic resistance values of the source/drain diffused layers are reduced. Thus, a miniaturized MOSFET having high drivability can be realized.

BRIEF DESCRIPTION OF THE DRAWINGS

In the accompanying drawings;

FIGS. 1A–1D are cross sectional views of process steps showing the structure of a conventional semiconductor device of the LDD structure and its manufacturing process.

FIG. 6 is a graph showing a simulated result of the extent that a depth of Xj at which the concentration reaches the peak concentration of the second diffused layer contributes to the S-factor which is an inverse of an inclination in a subthreshold region.

FIG. 7 is a graph showing a simulated result of the extent that a depth of Xj, that the concentration reaches the peak concentration of the second diffused layer, contributes to the threshold voltage shift Vth.

FIG. 9 is a graph showing a profile of boron after heat treatment of boron doped polysilicon deposited on a nitrided oxide film.

FIG. 10 is a graph showing a profile of boron after heat treatment of boron doped polysilicon.

FIGS. 15A and 15B are graphs each showing a profile when time is changed under the condition where temperature is constant.

FIG. 26 is a graph showing a shift of the threshold voltage Vth after stress has been continuously applied under the condition where the drain voltage is fixed.

FIG. 27 is a graph showing the gate voltage dependency of a change of a charge pumping current.

FIGS. 36A–36F are device cross sectional views of every process step showing a method of manufacturing a FET without using stopper film, according to this invention.

DESCRIPTION OF THE PREFERRED EMBODIMENTS

[First Embodiment]

A first embodiment of this invention will now be described with reference to the attached drawings.

Figure 2:
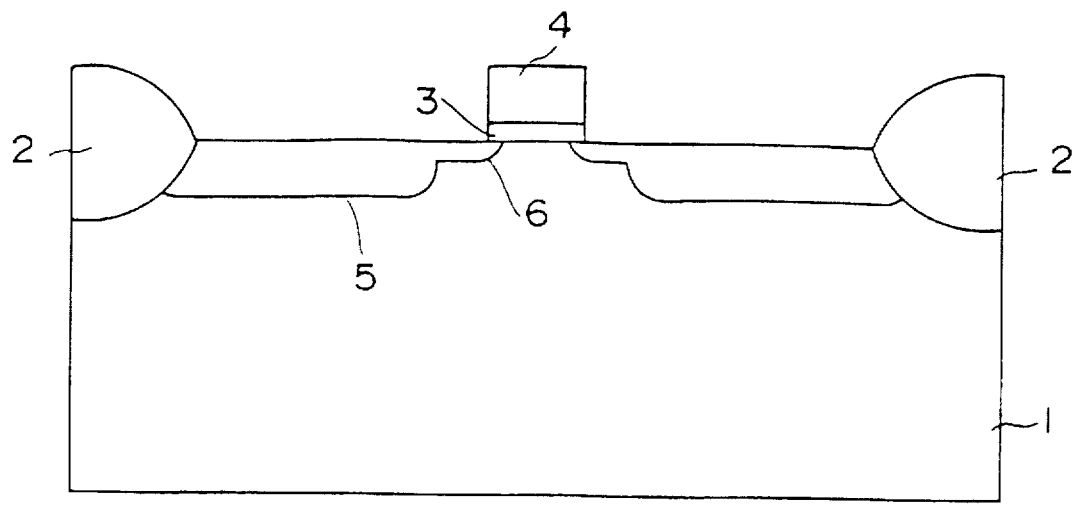
FIG. 2 is a device cross section showing the structure in a MIS type semiconductor device of this invention.
Figure 3:
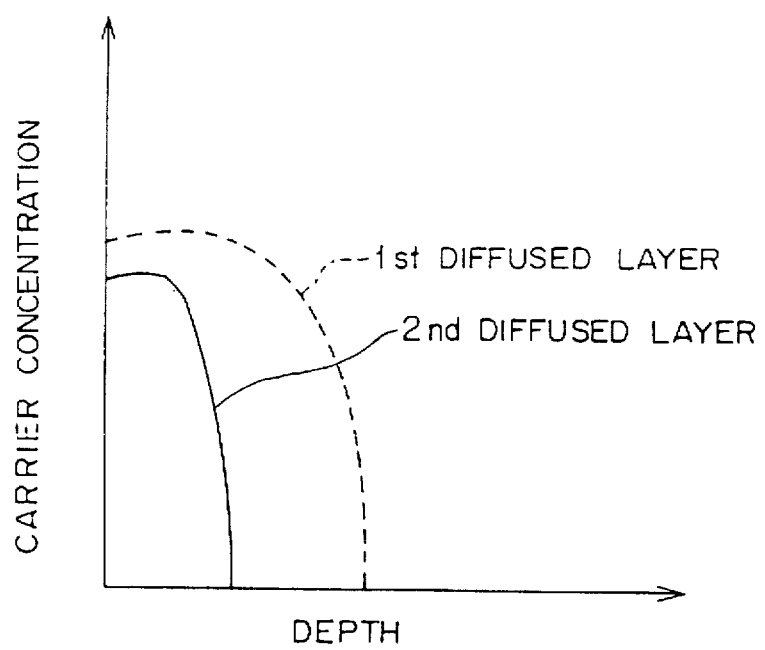
FIG. 3 is a graph showing an impurity profile of diffused layers in FIG. 2.

FIG. 2 is a device cross sectional view showing the structure in a MIS type semiconductor device of this invention. As seen from this figure, a region of a semiconductor substrate 1 surrounded by an element isolation region 2 is defined as an element region and on the surface in this element region, a gate insulation film 3 and a gate electrode 4 are formed on the substrate 1. Impurity diffused layers are formed in the substrate outside of the gate electrode. The impurity diffused layers serving as a source and a drain each have such a diffused layer (first diffused layer) to satisfy the limit of a leakage current and a resistance in the source and drain regions for carrying out the salicide process, and a shallow diffused layer (second diffused layer) where a high concentration of carriers is caused to exist in order to allow the high resistance region below the side walls to be a low resistance region. In this instance, the distribution profile in a depth direction of the second diffused layer is a profile, as shown in FIG. 3, in which the second diffused layer has a depth shallower than the first diffused layer and has a carrier concentration more than $5 \times 10^{18}$ $cm^{-3}$ at its peak and equal to a carrier concentration of the semiconductor substrate at the depth below 0.04 μm.

FIG. 4A–4D are cross sectional views every respective process steps for explaining a manufacturing process for obtaining the structure of FIG. 2.

Figure 4A:
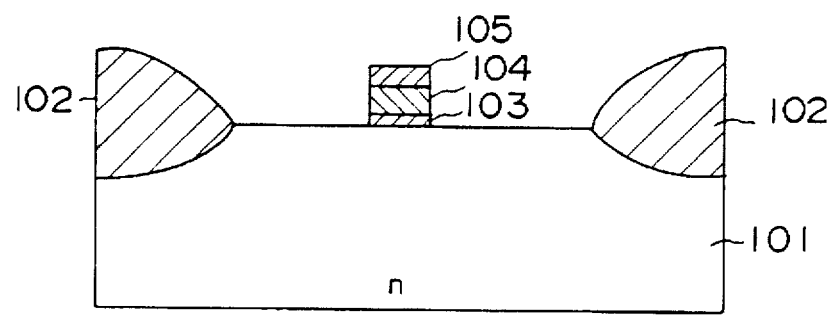
FIGS. 4A–4D are device cross sectional views according to respective process steps explaining a manufacturing process for obtaining the structure of FIG. 2.

First, ion implantation for the well is implemented into a silicon substrate 101 thereafter to carry out extending diffusion to form a well to subsequently carry out ion implantation for prevention of the parasitic channel. Thereafter, selective oxidation is implemented onto the substrate 101 surface to form field oxide film portions 102 to isolate the device regions from each other. Then, a gate electrode oxide film 103 is formed by theremal oxidation on the entire surface of the region surrounded by the oxide film portions 102 on the substrate 101 to subsequently form a polysilicon film 104 which is a gate electrode material on the entire surface thereof by using the LPCVD (Low Pressure CVD) process so that its thickness reaches 2000 angstroms. Further, a silicon oxide film 105 is formed by the APCVD (Atmospheric Pressure CVD) process on the polysilicon film 104. A mask of photoresist is then formed by the optical lithography on the silicon film 105 electrode to apply patterning, at a time, to the double layers of the oxide films 103 and 105 and the intermediate polysilicon film 104 by using the RIE process thus to form a gate electrode comprised of the gate oxide film 103, the polysilicon film 104 and the silicon oxide film 105 (FIG. 4A).

Figure 4B:
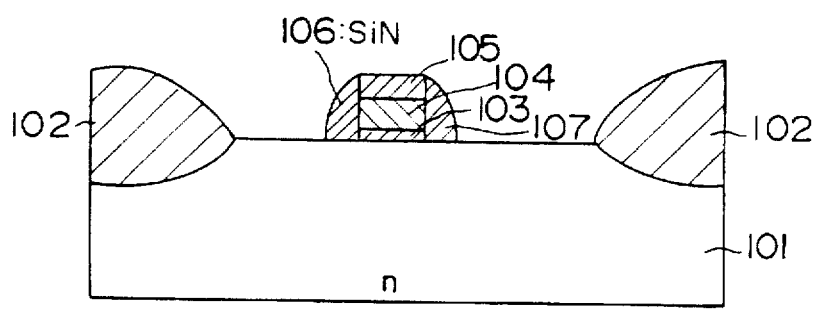

Then, a silicon nitride film is formed on the entire surface of the substrate 101 by using the APCVD process to subsequently carry out the the RIE process to thereby form nitride film side walls 106, 107 on the side surfaces of the gate electrode (FIG. 4B).

Thereafter, ions of impurity $BF_2^+$ are implanted into the substrate 101 under the condition of a dose of $3\times10^{15}$ cm$^{-2}$ and an acceleration energy of 30 KeV to carry out activation of the implanted ions by using the RTA process (1000° C., 20 seconds). In the figure, reference numeral 108 represents a diffused layer serving as a source, and reference numeral 109 represents a diffused layer serving as a drain. By this formation process, diffused layers 108, 109 are caused to have a carrier profile having a peak concentration of $2.4\times10^{20}$ cm$^{-3}$ and a junction depth of 0.14 μm when the concentration of the substrate is $1\times10^{18}$ cm$^{-3}$.

Figure 4C:
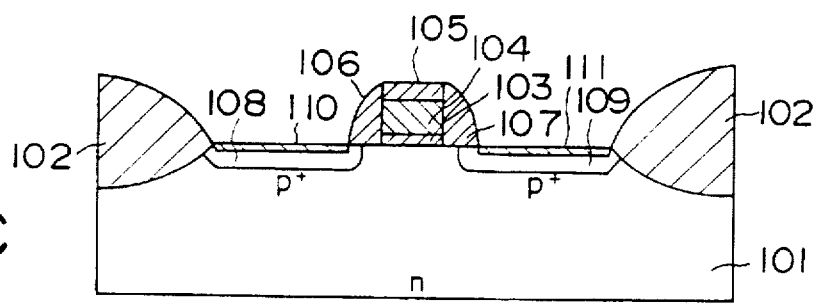

Thereafter, a titanium film is formed on the entire surface of the substrate 101 by the sputtering process so that its thickness reaches 300 angstroms to carry out the RTA process under the condition of 750° C. and 30 seconds, to thereby selectively form titanium-silicide films 110, 111 only on the diffused layers 108, 109 respectively serving as the source and the drain. Then, titanium which has not reacted is etched by a mixed liquid of ammonia, hydrogen peroxide solution and water or a mixed liquid of sulfuric acid and hydrogen peroxide solution. By this process step, electrodes connecting to the source and drain regions can be formed in a self-alignment manner. Further, since the carrier concentration at the interface is the order of $1\times10^{20}$ cm$^{-3}$, the contact resistance resistance is sufficiently lowered (FIG. 4C).

Figure 5A:
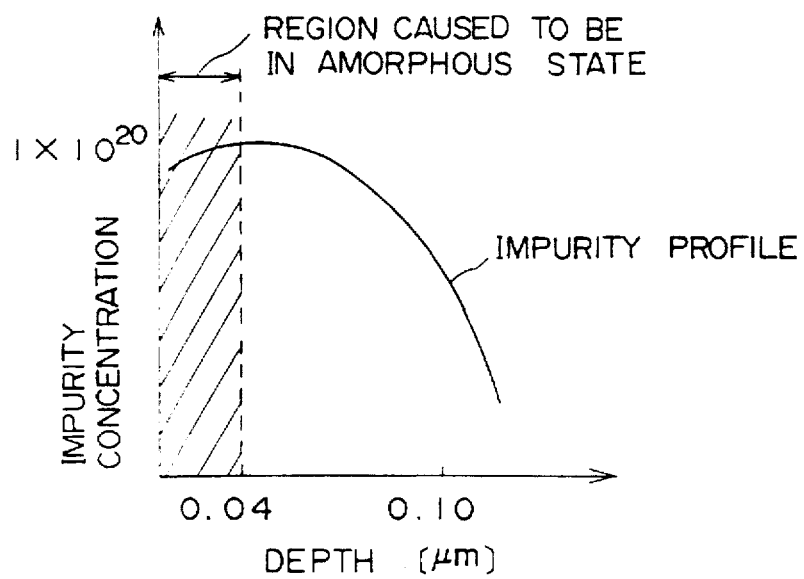
FIGS. 5A and 5B graphs showing an impurity profile of the diffused layers.

Thereafter, the silicon nitride film side walls 106, 107 are removed by the hot phosphoric acid treatment to implement ion implantation of $BF_2^+$ into the substrate 101 under the condition of an acceleration voltage of 30 KeV and a dose of $3\times10^{15}$ cm$^{-2}$. Namely, by implanting ions of $BF_2^+$ in the atmosphere of nitrogen under the condition of a dose more than $1\times10^{15}$ cm$^{-2}$ as shown in FIG. 5A, only the region shallower than the profile of impurity from the semiconductor substrate 101 surface is caused to be in an amorphous state.

As well known, the frequency P of the moving of an impurity existing at the interstitial position to an adjacent vacancy is expressed as follows:

$$P = X_V \cdot Z \cdot v \cdot \exp(-\Delta Gm/kT)$$

where $X_V$ is a vacancy density, Z is the number of the nearest neighbor lattice points, v is the frequency of impurity atoms, and $\Delta Gm$ is an energy barrier. Further, the density of vacancy existing in a thermodynamically stable state is expressed as follows:

$$X_V = \exp(S_V/k) \cdot \exp(-Ef/kT)$$

where $S_V$ is an increment in entropy by formation of a vacancy, Ef is a vacancy formation energy, k is Boltzman factor, and T is an absolute temperature with elevation of temperature. As seen from this formula, the vacancy density exponentially increases. Therefore, in annealing by using a low temperature, since a larger number of vacancies exist in the layer caused to be in an amorphous state in the vicinity of the substrate surface as compared to vacanies at the portion deeper than the region caused to be in an amorphous state of the substrate, impurity atoms are apt to enter the interstitial position, viz., the activation rate becomes high.

Here, the width of the region caused to be in an amorphous state and the number of lattice points in that region, i.e., the width of the region having a high carrier concentration and the peak concentration are determined by the ion implantation condition. For example, in the case of ion implantation of $BF_2^+$, the region having a depth of 0.04 μm from the surface is allowed to serve as a region caused to be in an amorphous state under the condition of a dose of $3\times10^{15}$ cm$^{-2}$ and an acceleration voltage of 30 KeV.

This depth is obtained by the measured result by RBS (Ratherford Back Scattering) method.

Further, a difference between a carrier concentration of the substrate and a carrier concentration of the region caused to be in an amorphous state is determined by the annealing temperature. By an annealing of one hour and a temperature from 500° C. to 750° C., the peak concentration of the region caused to be in an amorphous state could be more than $5\times10^{20}$ cm$^{-3}$ and the activation rate could be equal to substantially 100%. In addition, the depth where the carrier concentration of the substrate reaches $1\times10^{18}$ cm$^{-3}$ could be less than 0.04 μm.

Figure 4D:
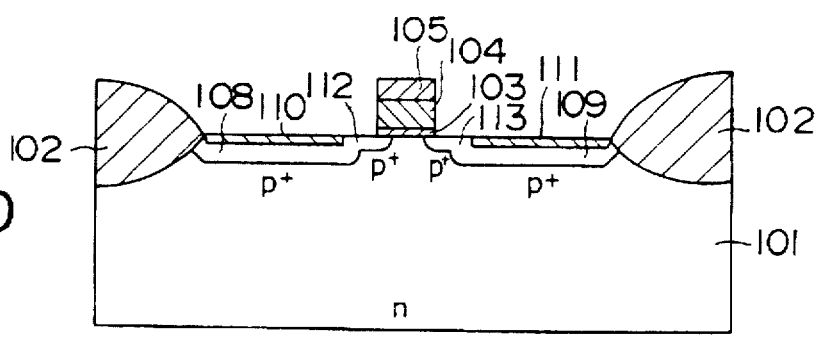
Figure 5B:
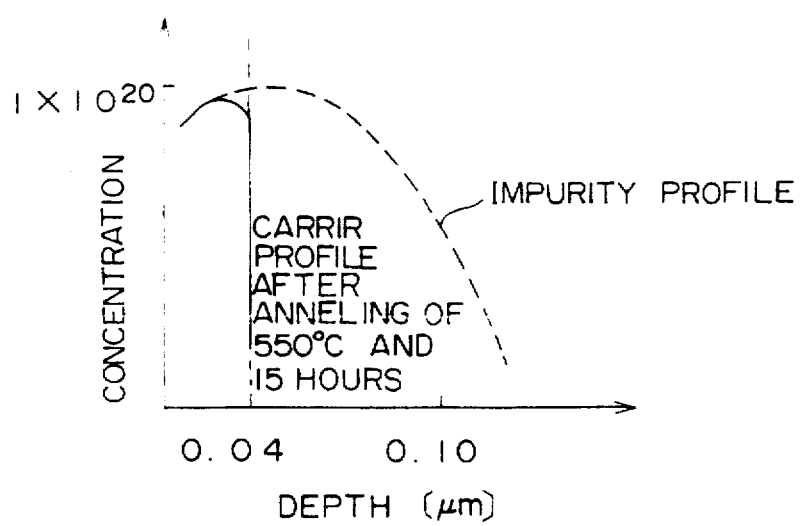

Subsequently, annealing is conducted in the atmosphere of nitrogen under the condition of 550° C. and 15 hours. Thus, there is provided, as shown in FIG. 5B, a shallow and high concentration carrier profile such that the peak concentration is more than $1\times10^{20}$ cm$^{-3}$ and the junction depth is 0.032 μm (FIG. 4D).

Namely, by carrying out the heat treatment for a time determined by the relationship between crystallization by the solid phase growth in the region caused to be in an amorphous state and the influence on the carrier profile by diffusion of impurity, there are formed, on the respective channel formation regions of the diffused layers 108, 109 within the semiconductor substrate 101, diffused layers shallower than those regions, and having a profile such that a carrier concentration is more than $5\times10^{18}$ cm$^{-3}$ at the peak, and is in correspondence with the carrier concentration of the semiconductor substrate 101 at a depth less than 0.04 μm. It is to be noted that any temperature in a range from 500° C. to 750° C. may be employed.

In accordance with the MOSFET of such a structure obtained by the above-mentioned method, the source and the drain respectively have diffused layers 108, 109 positioned on the field oxide film 102 side and diffused layers 112, 113 positioned on the channel formation region side in such a manner that they are relative to each other. These diffused layers 112, 113 are formed so that they are shallow and have high concentration as described above, whereby the parasitic resistance can be reduced while suppressing the short-channel effect in a miniaturized MOS device. As a result, a large drain current can be obtained. In addition, in carrying out formation of electrodes 110, 111 by the salicide process into the diffused layers 108, 109, the resistance value of the contact resistance can be reduced and the leakage current can be suppressed. Moreover, the source and drain regions can be of low resistivity.

FIGS. 6 and 7 show the result obtained by carrying out simulation in connection with a MOSFET having a structure according to this invention. Specifically, FIG. 6 shows to what degree the depth Xj when the concentration reaches the peak concentration of the second diffused layer contributes to S-factor (indicating the inverse of maximum inclination in subthreshold region), and FIG. 7 similarly shows to what degree the depth Xj contributes to the threshold voltage Vth.

First referring to FIG. 6, it is seen that the S-factor becomes large when the depth Xj is above 400 angstroms (i.e., 0.04 μm), and it is thus desirable that the depth Xj is less than 400 angstroms. Further, as shown in FIG. 7, it is seen that the elevation rate of the threshold voltage Vth becomes high when the depth Xj is above 400 angstroms. Accordingly, it is similarly apparent that it is desirable that the depth Xj be less than 400 angstroms.

FIGS. 8A–8D show a second manufacturing process according to this invention and a device structure of a p-channel MOSFET obtained by that manufacturing process.

Figure 8A:
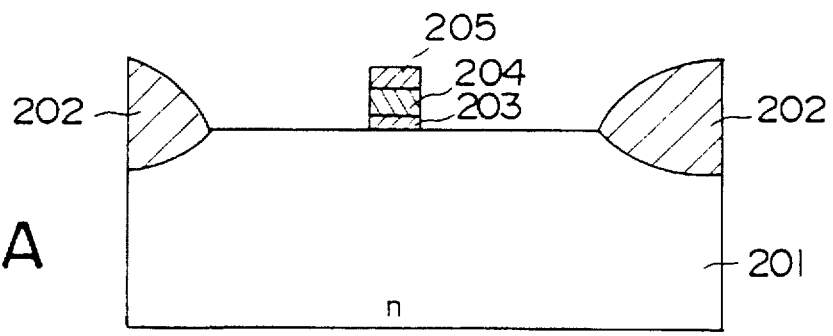
FIGS. 8A–8D are device cross sectional views at every respective process step, showing a second manufacturing process of a p-channel MOSFET according to this invention and a device obtained by that manufacturing process.

In this figure, by a process similar to that in FIGS. 4A–4D, a field oxide film 202, and a gate electrode comprised of a gate oxide film 203, a polysilicon film 204 and a silicon oxide film 205, are formed on a silicon substrate 201 (FIG. 8A).

Figure 8B:
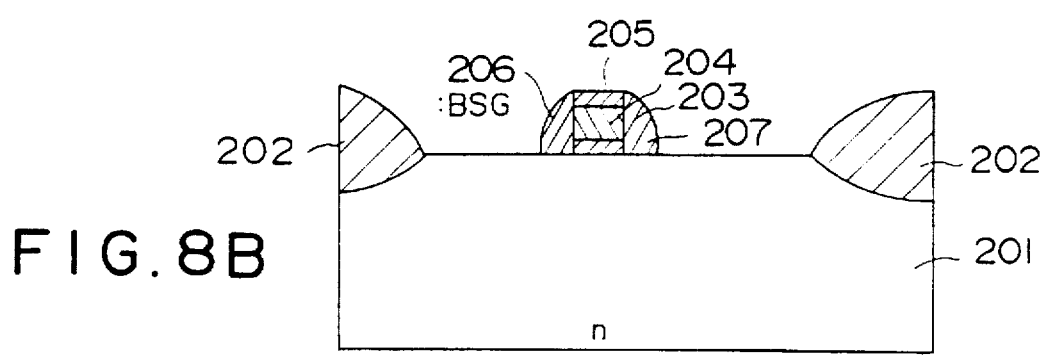

Thereafter, a BSG film (B concentration is 18 mol %) is formed by the LPCVD process on the entire surface of the substrate 201 to form BSG film side walls 206, 207 on the both side surfaces of the gate electrode by the RIE process (FIG. 8B).

Figure 8C:
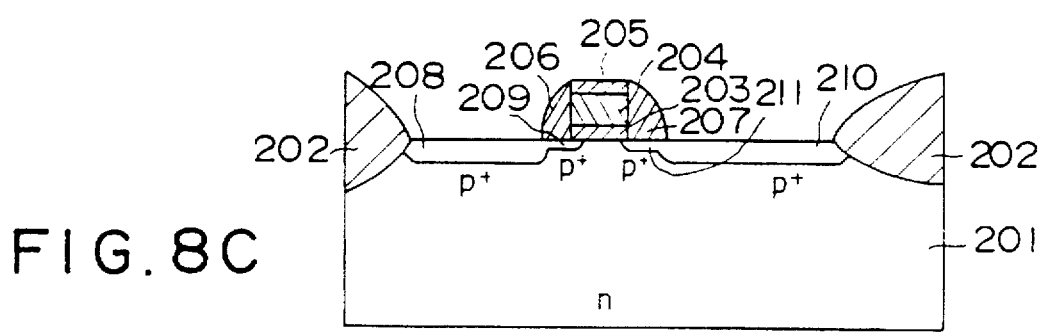

Then, impurity $BF_2^+$ is ion-implanted into the entire surface of the substrate 201 under the condition of a dose of $3 \times 10^{15}$ cm$^{-2}$ and an acceleration energy of 30 KeV. Further, RTA is carried out under the condition of 1000° C. and 15 seconds to carry out activation of impurities. By heat, the RTA, impurity in the BSG film side walls 206, 207 is diffused into the substrate 201, so shallow diffused layers are formed below the BSG film side walls 206, 207. Thus, deep diffused layers 208, 210 serving as source and drain regions are formed, and shallow diffused layers 209, 211 are formed on the channel formation region sides of the both diffused layers 208, 210. In these shallow diffused layers 209, 211, a distribution in a depth direction of the carrier concentration of $1 \times 10^{18}$ cm$^{-3}$ at the depth of 0.04 μm from the substrate 201 surface and a peak carrier concentration of $5 \times 10^{19}$ cm$^{-3}$ at the surface of the substrate is obtained (FIG. 8C).

Figure 8D:
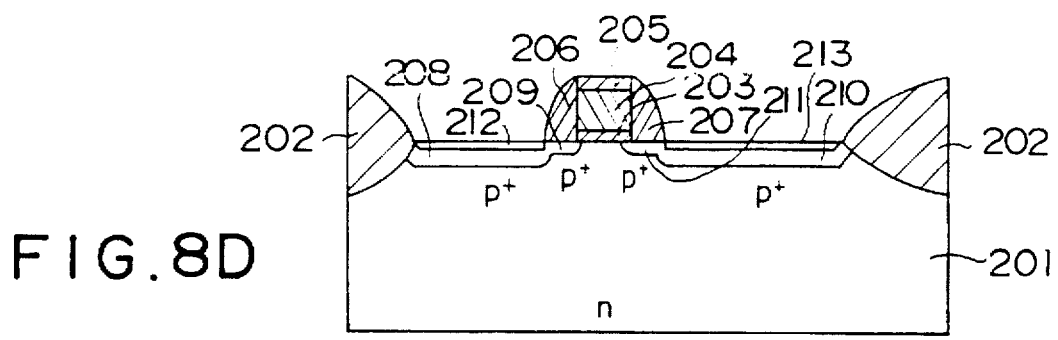

Thereafter, by carrying out a salicide process similar to that in the above-described embodiment, metal silicide films 212, 213 are formed on the source and the drain (FIG. 8D).

By the above-mentioned process, a device structure according to this invention can be provided.

It is to be noted that, in the above-mentioned process, in forming polysilicon film 204, it is desirable to use the doped polysilicon which can be deposited by the LPCVD process and simultaneous impurity doping is conducted. It is also desirable to allow the gate oxide film 203 to be formed as a nitrided oxide film.

The profile of boron when B (boron) doped polysilicon is deposited on a nitrided oxide film by the LPCVD process thereafter to allow it to undergo high temperature and short time heat treatment of 1000° C. and 15 seconds, is shown in FIG. 9. By using B (boron) doped polysilicon, the boron concentration in the gate is uniformly $4 \times 10^{20}$ cm$^{-3}$. At this concentration, the Fermi level is in a valence band at an ordinary temperature, and represents a degenerate level. Further, because the gate oxide film, is formed as a nitrided oxide film although it has an extremely thin thickness of 32 angstroms, the penetration of boron into the substrate is substantially suppressed. From this fact, it is extremely useful to use B (boron) doped polysilicon and nitrided oxide film as the gate and the gate insulator for the purposes of suppressing depletion of the gate and the penetration of boron.

Further, in a P-channel MOSFET having a gate length of 0.5 μm, comparison between a drivability in the case of a gate formed by ion implantation of $BF_2$ and a drivability in the case of a gate formed by B (boron) doped polysilicon was conducted. In both cases, a nitrided oxide film is used as the gate insulator. The profile of boron when the film thickness of polysilicon is caused to be 2000 angstroms to implant $BF_2$ under the condition of an acceleration voltage of 35 KeV and a dose of $1 \times 10^{15}$ cm$^{-2}$ to carry out an activation high temperature short time heat treatment of 1,000° C. and 15 seconds is shown in FIG. 10. From this figure, it is seen that, while penetration of boron is suppressed by the nitrided oxide film, the Fermi level of polysilicon exists in an energy gap at an ordinary temperature because the boron concentration in polysilicon is $6 \times 10^{19}$ cm$^{-3}$, and therefore does not reach a degenerate level.

Figure 11:
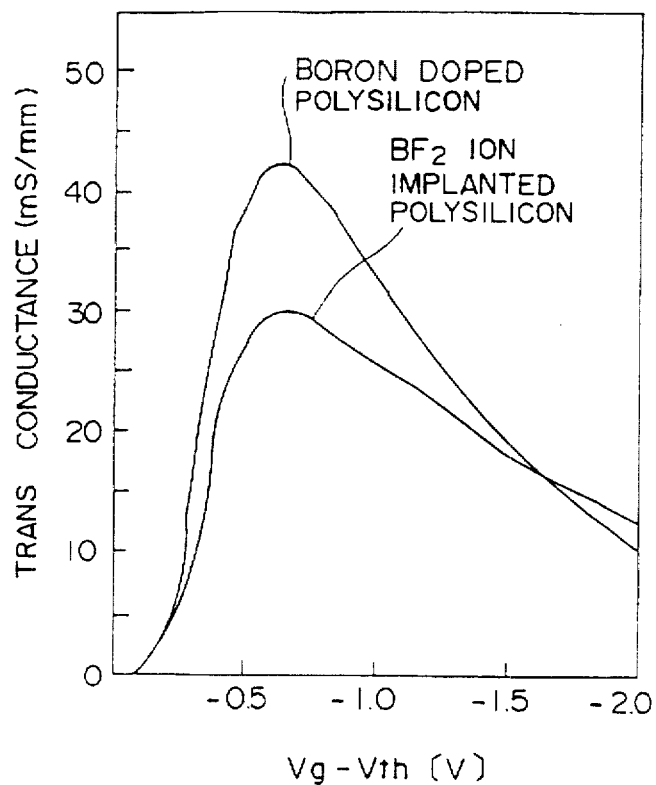
FIG. 11 is a graph showing a Vg-Vth dependency of transconductance.

Dependence of transconductance on Vg-Vth when the drain voltage is caused to be -2 volts is shown in FIG. 11. Although there is no difference between gate voltages giving respective peaks, in the case of the gate by ion implantation, deterioration by depletion of the gate appears with respect to a gate by the B (boron) doped polysilicon by about 25% in terms of the peak value.

Further, in a p-channel MOSFET having a gate length Lg of 0.15 μm, comparison between a drivability in the case of a gate film using $SiO_2$ film and a drivability in the case of a gate film using a nitrided oxide film, i.e., comparison of the gate voltage dependency of the drain current in both cases was conducted. In both cases, B doped polysilicon is used for the gate.

Figure 12:
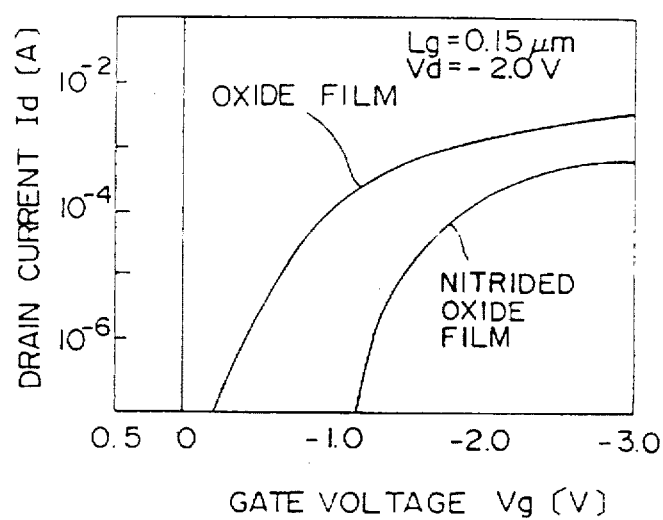
FIG. 12 is a graph showing the result obtained by comparison between a gate voltage dependency of a drain current using a $SiO_2$ film as a gate film and using a nitrided oxide film as the gate film.

From FIG. 12, it is seen that, in the case of the gate film using the $SiO_2$ film, the threshold voltage Vth is lowered because the substrate surface concentration is lowered by penetration of boron, and depletion takes place resulting from lowering of the concentration at the gate film interface of B doped polysilicon, resulting in an increased S-factor.

In forming source and drain regions according to this invention, solid phase diffusion from boron silicate glass having a boron concentration of $4 \times 10^{21}$ cm$^{-3}$ (18 mol %) into the substrate is carried out. The examined result of the temperature/time dependency of the pre-treatment and the high temperature and short time heat treatment of the solid phase diffusion is indicated below.

First, the evaluated result of the pre-treatment dependency is shown.

Figure 13:
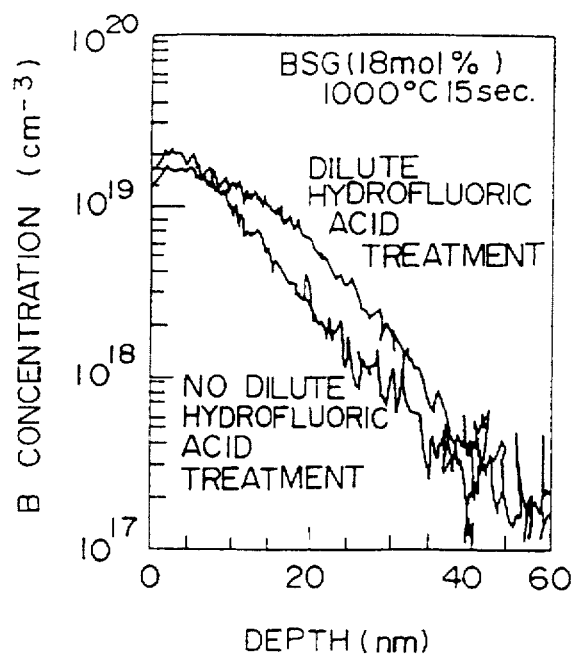
FIG. 13 is a graph showing the comparison between a profile of boron in the subtrate when pre-treatment is conducted and that profile when no pre-treatment is conducted.

The profile of boron in the substrate in the cases where the treatment of hydrochroric peraqueous system is carried out and dilute hydrofluoric acid (0.5%) treatment is carried out as the pre-treatment for two minutes is shown in FIG. 13. In both cases, diffusion is conducted under the condition of the high temperature and short time heat treatment of 1000° C. and 15 seconds. Only a slight difference between a depth where the surface concentration reaches $1 \times 10^{18}$ cm$^{-3}$ and a depth where the boron concentration reaches $1 \times^{18}$ cm$^{-3}$ can be observed. However, when attention is drawn to the total implanted amount, there results a higher concentration in the case where the dilute hydrofluoric acid treatment is conducted. One can understand the reason if attention is drawn to the fact that an oxide film is not removed on the substrate surface by the hydrochroric peraqueous system treatment. The diffusion process of boron when an oxide film exists at the interface between the substrate and a boron-silicate glass is considered as follows. Namely, at the initial time of the heat treatment, boron is diffused into the substrate through the oxide film, so such boron is not so implanted thereinto. When the concentration of boron in the oxide film increases to become equal to that of boron in the boron-silicate glass, the implanted amount becomes large.

After the dilute hydrofluoric acid treatment, even if the treated substrate is rinsed with pure water of dissolved oxygen of 5 ppb for 30 minutes, any change of the profile of boron is not observed as compared to that in the case of the treated substrate which does not undergo rinsing with water. The reason why such a phenomenon occurs is as follows. Namely, with respect to the fact that there is no natural oxide film because dissolved oxygen is sufficiently less, so no oxide film is formed during rinsing, there is no difference between the treatment using rinsing and the treatment not using rinsing. In the case where no rinsing is carried out, boron terminates on the surface, thus preventing the surface from being oxidized at a substrate temperature of 450° C. at the time of an APCVD process. In contrast, even in the case where rinsing is carried out with pure water including less dissolved oxygen quantity, oxygen terminates on the surface, thus obtaining similar effects.

The heat process condition dependency of the solid phase diffusion as described above will be indicated below.

Figure 14:
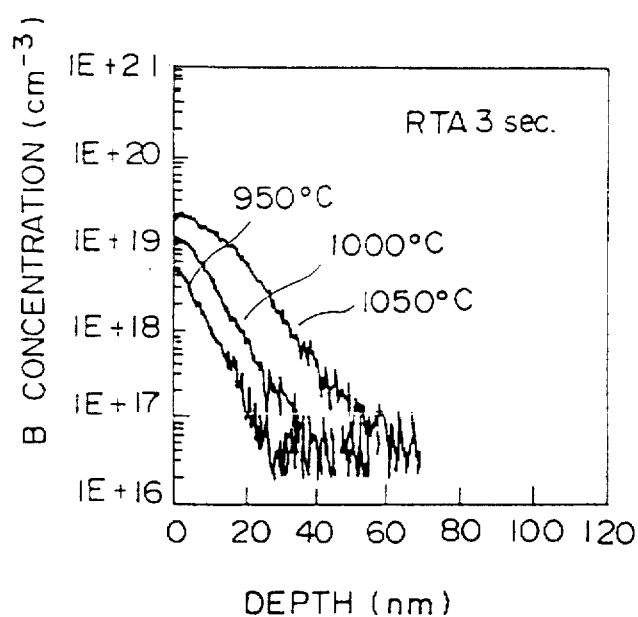
FIG. 14 is a graph showing a profile of solid phase diffusion when temperature is changed under the condition where time is a constant.
Figure 16:
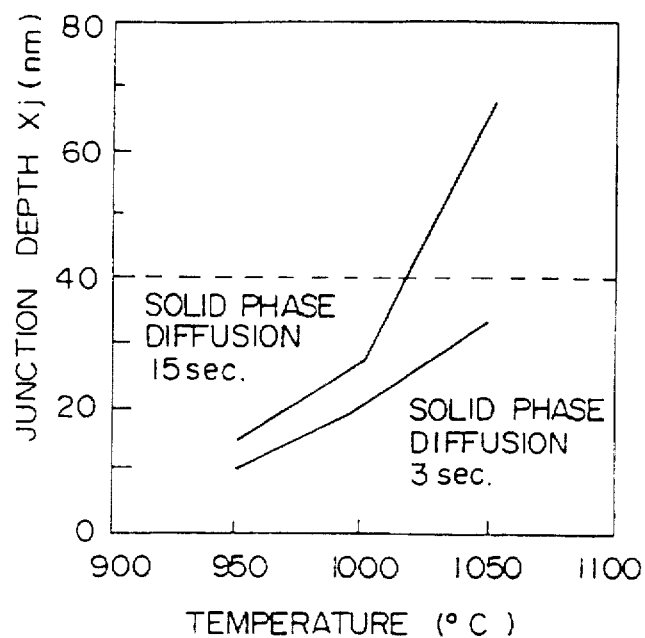
FIG. 16 is a graph showing a heat process condition dependency of the junction depth Xj.
Figure 17:
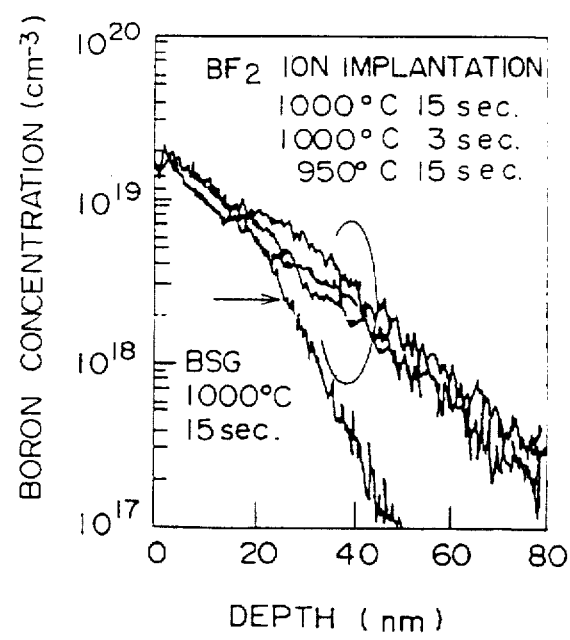
FIG. 17 is a graph showing a profile in the case where a high temperature and short time heat treatment have been conducted after ion implantation.

The heat process condition dependency of the high temperature and short time heat treatment of the profile of boron in the substrate after the solid phase diffusion from boron-silicate glass is shown in FIGS. 14, 15A–B, and 16. FIG. 14 shows a profile of temperatures of 950° C., 1000° C. and 1050° C. when the time is set to 3 seconds. FIG. 15A shows a profile of times of 3 and 15 seconds when the temperature is set to 1000° C. FIG. 15B shows a profile of times of 3 and 15 seconds when the temperature is set to 1050° C. The heat process condition dependency of the junction depth Xj is shown in FIG. 16. By taking into consideration the above-mentioned results and the heat process required for which ion-implanted impurity for forming the first diffused layer on the outside of the side wall is activated, the heat process condition of the solid phase diffusion from boron-silicate glass in the trial manufacture of the device was such that the temperature is 1000° C. and the time is 15 seconds. Further, the profile where high temperature and short time heat treatment is carried out after implementation of ion implantation ($BF_2$, 15 KeV, $4 \times 10^{13}$ $cm^{-2}$) is shown in FIG. 17. In the activation by ion implantation and high temperature and the short time heat treatment, it is seen that it is difficult to form a diffused layer shallower than that by the solid-phase diffusion from boron-silicate glass.

FIGS. 18A–18D show a third manufacturing process and a device structure of an n-channel MOSFET obtained by that manufacturing process.

Figure 18A:
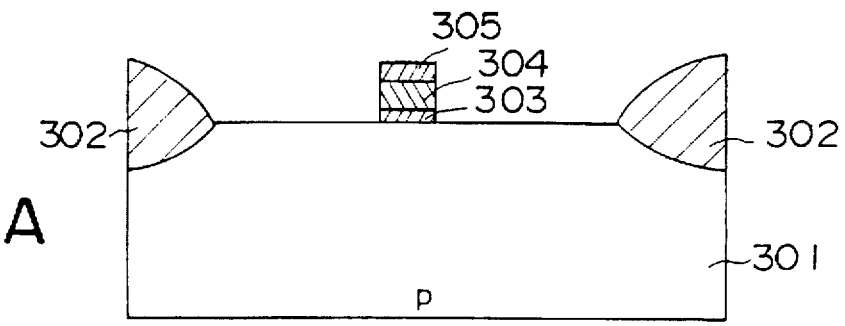
FIGS. 18A–18D are device cross sectional views of every process step showing a third manufacturing process according to this invention and a structure of an n-channel MOSFET obtained by that manufacturing process.

First, by a process similar to the above, a field oxide film 302 and a gate electrode comprised of a gate oxide film 303, a polysilicon film 304 and a silicon oxide film 305 are formed on a silicon substrate 301 (FIG. 18A).

Figure 18B:
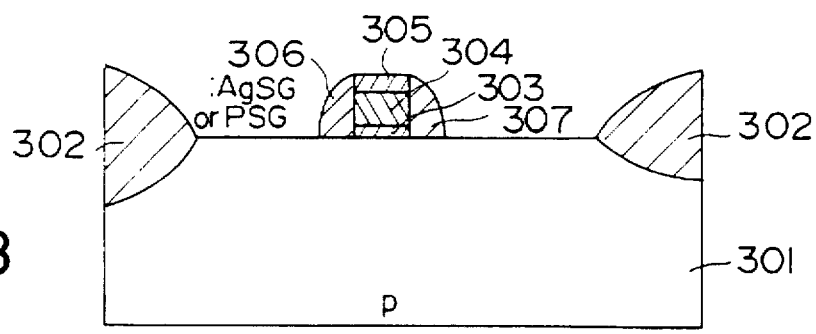

Thereafter, an AsSG film (As concentration 10%) is formed on the entire surface of the substrate 301 by using the LPCVD process to form AsSG film side walls 306, 307 on the both side surfaces of the gate electrode by the RIE process (FIG. 18B).

Figure 18C:
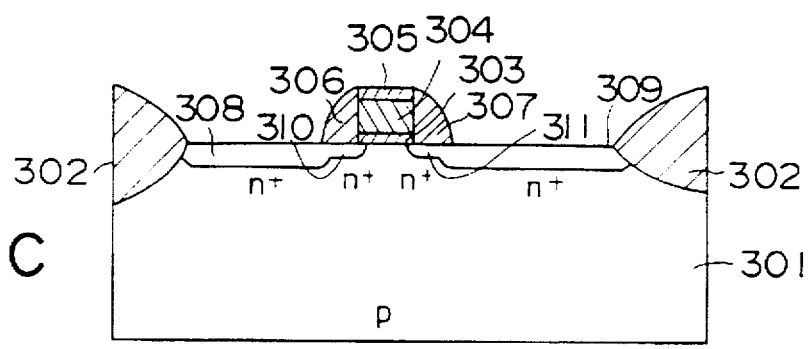

Then, the impurity As is ion-implanted into the entire surface of the substrate 301 under the condition of a dose of $3 \times 10^{15}$ $cm^{-2}$ and an acceleration energy of 30 KeV. Further, the RTA process is carried out under the condition of 1050° C. and 1 minute to carry out that activation of the impurities. By heat in RTA, impurity in the AsSG film side walls 306, 307 are diffused into the substrate 301. As a result, shallow diffused layers are formed below the AsSG film side walls 306, 307. Thus, deep diffused layers 308, 309 serving as source and drain regions are formed, and shallow diffused layers 310, 311 are formed on the channel formation region sides of the both diffused layers 308, 309. With respect to these shallow diffused layers 310, 311, a distribution in a depth direction having a carrier concentration of $1 \times 10^{18}$ $cm^{-3}$ at a depth of 0.04 μm from the substrate 301 surface and a carrier concentration of $5 \times 10^{18}$ $cm^{-3}$ at the peak position is obtained (FIG. 18C).

Figure 18D:
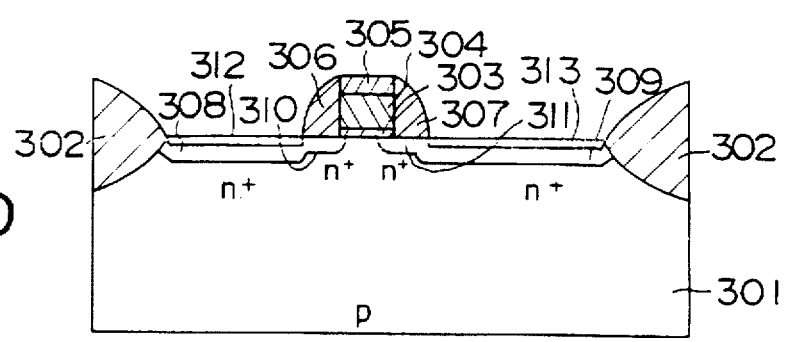

Thereafter, by carrying out a salicide process similar to that of the above-mentioned embodiments, metal silicide films 312, 313 are formed on the source and drain regions (FIG. 18D).

It is to be noted that a PSG film may be used in place of the AsSG film.

FIGS. 19A–19D show a manufacturing process and a device structure in the case where the third method is similarly applied to a p-channel MOSFET.

Figure 19A:
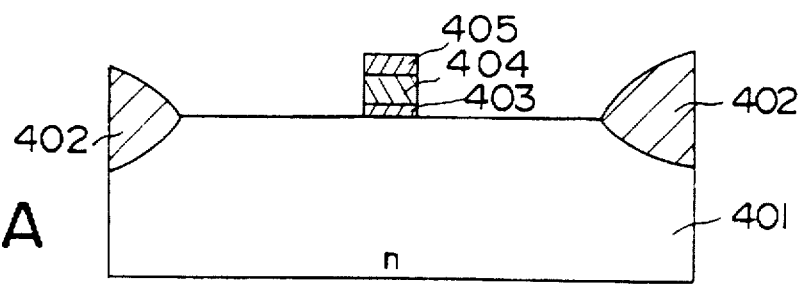
FIGS. 19A–19D are device cross sectional views for every process step, showing a manufacturing process in the case where the third manufacturing process is applied to a p-channel MOSFET and a device structure is obtained by that manufacturing process.

First, in these figures, by a process similar to that of the above-described embodiment, a field oxide film 402 and a gate electrode comprised of a gate oxide film 403, a polysilicon film 404 and a silicon oxide film 405 are formed on a silicon substrate 401 (FIG. 19A).

Figure 19B:
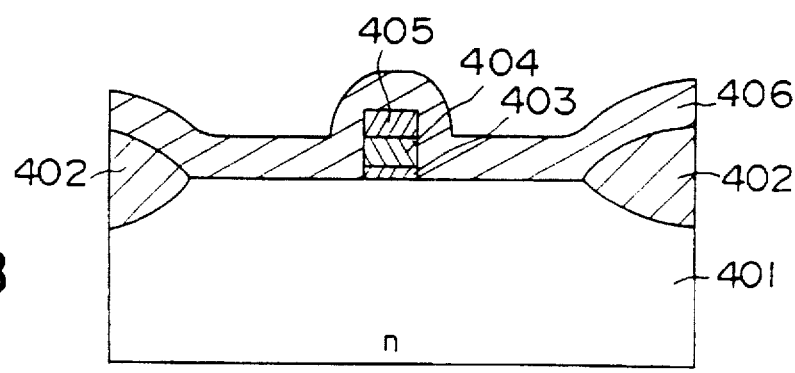

Thereafter, a BSG film 406 is deposited on the entire surface of the substrate by the CVD process in the case of the p-channel MOSFET (FIG. 19B).

Figure 19C:
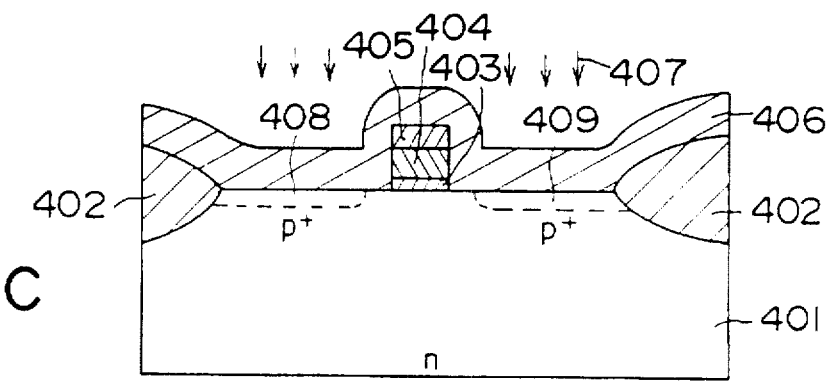

Subsequently, in the case where the film thickness of the BSG film is assumed to be 1000 angstroms, $B^+$ ions 407 are implanted at an acceleration voltage of 35 KeV. Thus, ions which have penetrated through the BSG film 406 are implanted into the substrate 401. As a result, an ion implanted region 408 serving as a source region and a ion implanted region 409 serving as a drain region are formed. At this time, the regions having a width of 0.09 μm on the both sides of the gate electrode are masked because the BSG film 406 is thickened with respect to the ion implantation direction, and do not undergo ion implantation (FIG. 19C).

Figure 19D:
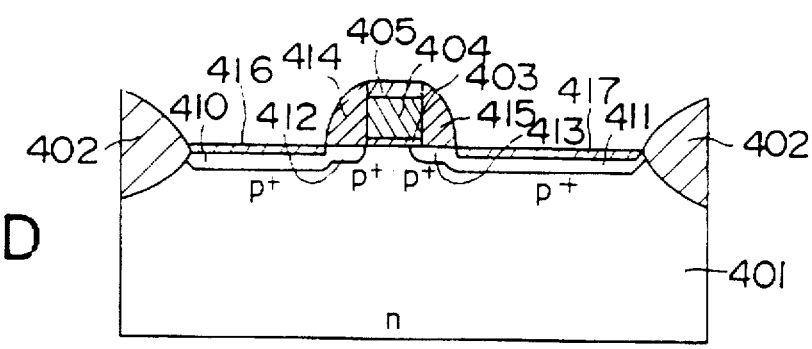

Thereafter, heat treatment of high temperature and short time (1000° C. 15 seconds) by the RTA process is applied to thereby form diffused layers 410, 411 of the source and drain regions. By this RTA process, on both the surfaces of the gate electrode, the peak concentration equals $5 \times 10^{18}$ $cm^{-3}$ and the depth equals 0.04 μm. On the other hand, in the region away from the both surfaces of the gate by more than 0.09 μm, the peak concentration equals $3 \times 10^{20}$ $cm^{-3}$ and the depth becomes equal to 0.1 μm. Thereafter, BSG film side walls 414, 415 are caused to be left by the RIE process to carry out the salicide process to thereby form metal silicide films 416, 417 on the source and drain diffused layers 410, 411 (FIG. 19D).

FIGS. 20A–20D are device cross sectional views of every process step showing a fourth manufacturing process according to this invention and a device structure of a P-channel MOSFET obtained by that manufacturing process.

Figure 20A:
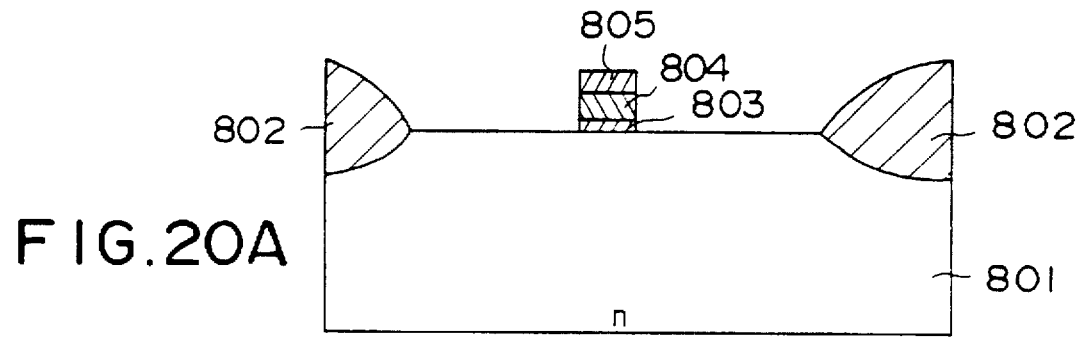
FIGS. 20A–20D are device cross sectional views for every process step showing a fourth manufacturing process according to this invention and a device of a P-channel MOSFET obtained by that manufacturing process.

First, in this figure, by a process similar to that of the above-mentioned embodiment, a field oxide film 802, and a gate electrode comprised of a gate oxide film 803, a polysilicon film 804 and an oxide film 805 are formed on a silicon substrate 801 (FIG. 20A).

Figure 20B:
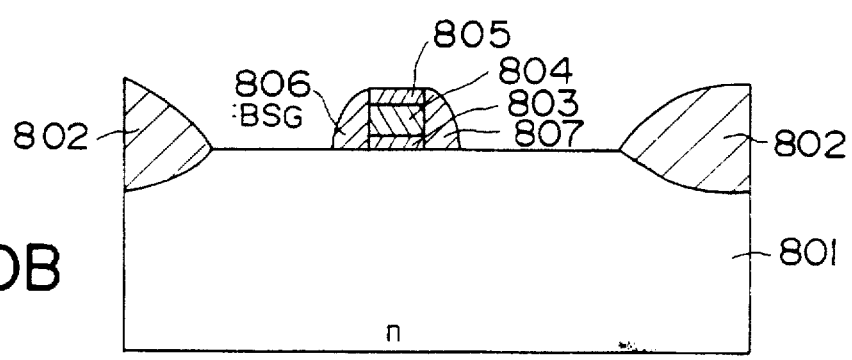

In the subsequent process step, because the device to be manufactured is a P-channel MOSFET, side walls 806, 807 by BSG film are formed on the side portions of the gate electrode (FIG. 20B).

Figure 20C:
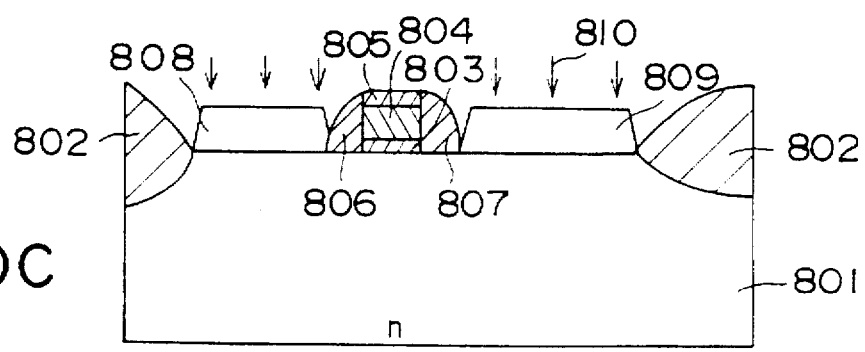

Subsequently, silicon is selectively epitaxially grown on the exposed portion where field oxide film 802, gate oxide film 803, polysilicon film 804 and oxide film 805, and side walls 806, 807 on the substrate 801 do not exist to form epitaxially grown films 808, 809 (FIG. 20C).

Figure 20D:
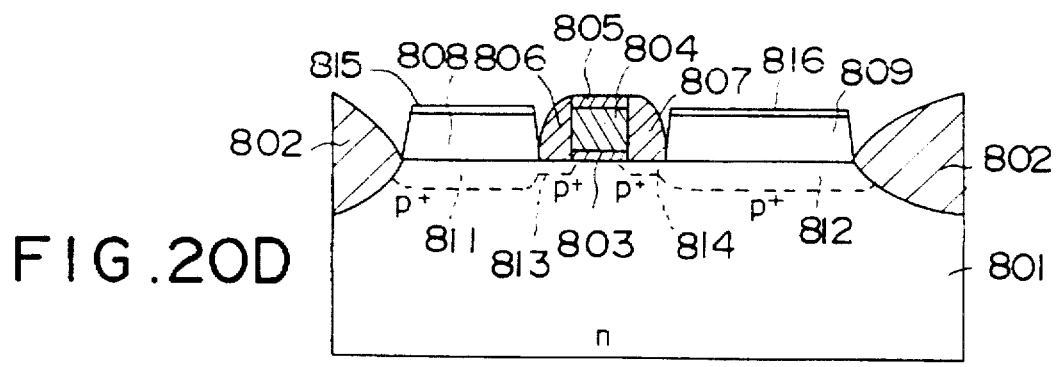
Figure 21:
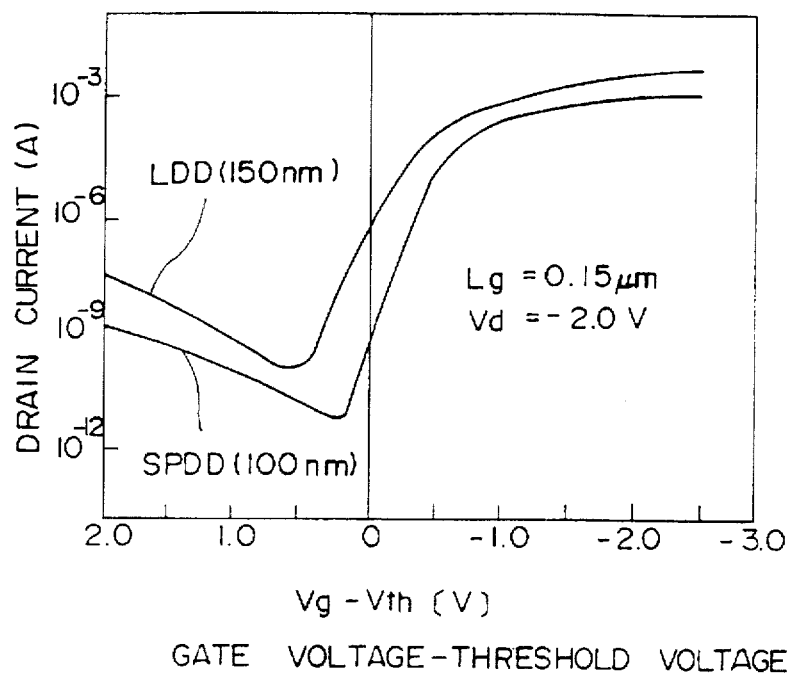
FIG. 21 is a graph showing a comparison between a sub-threshold characteristic in the SPDD structure of this invention and that of the LDD structure of this invention.

Thereafter, impurity ions 801 are implanted to carry out the treatment by the RTA process to thereby form, at the same time, diffused layers 811, 812 by ion implantation and diffused layers 813, 814 by solid phase diffusion from the side walls 806, 807. The diffused layers 811–814 thus formed satisfy the requirements of this invention. Namely, the diffused layers 813, 814 serve as a second diffused layer, and are formed as a shallow diffused layer which can avoid the short-channel effect. On the other hand, the diffused layers 811, 812 serve as a first diffused layer, and are formed as a relatively deep diffused layer which can avoid an increase of a leakage current followed by current consumption of the substrate 801. Thereafter, by carrying out a salicide process, metal silicide films 815, 816 serving as source and drain electrodes are formed on the surface portions of the epitaxially grown films 808, 809 (FIG. 20D).

It is to be noted that introduction of an impurity into the epitaxially grown film to form the first diffused layer may be carried out by any other method, except for ion implantation. For example, an impurity may be doped at the same time in carrying out epitaxial growth.

While an explanation has been given in connection with the p-channel MOSFET, it is needless to say that the process applied thereto may be employed for the n-channel MOSFET. In that case, it is required to use an AsSG film or a PSG film in place of the BSG film.

It is to be noted that, in the case of the n-channel MOSFET, as apparent from the fact described in the above-mentioned third embodiment, an AsSG film or a PSG film is used, and an n-type impurity such as As or P, etc. is used as an ion species of ion implantation. In addition, it should be noted that the fine conditions, such as temperature or time, etc. are not limited to the above.

The structure and the manufacturing process of the p-channel MOSFET and the n-channel MOSFET according to this invention have been described above. The evaluated results of these performances are shown below.

The following result was obtained in connection with the short-channel effect which greately affects the performance of a semiconductor element.

The sub-threshold characteristic when the drain voltage Vd is −2 volts in the SPDD structure and the LDD structure of this invention having a gate length Lg of 0.15 μm is shown in FIG. 15. The threshold voltage Vth is defined as a gate voltage when a drain current of 1 μA flows, and the abscissa represents a value obtained by subtracting the threshold voltage Vth in the long channel from the gate voltage. With respect to the LDD structure, an increase of the S-factor and an increase of Vth shift (ΔVth) by the short-channel effect appear. In contrast, with the structure of this invention, it is seen that the short-channel effect hardly appears. Further, since post-oxidation process is not carried out, a large leakage current on the OFF side (in the region where the gate voltage is positive) can be observed. In this case, however, a larger leakage current flows in the case of the LDD structure. This is because the overlap length of the gate, source and drain diffused layers in the case of the LDD structure is longer than that in the case of the SPDD structure, so the interband tunneling current increases.

Figure 22:
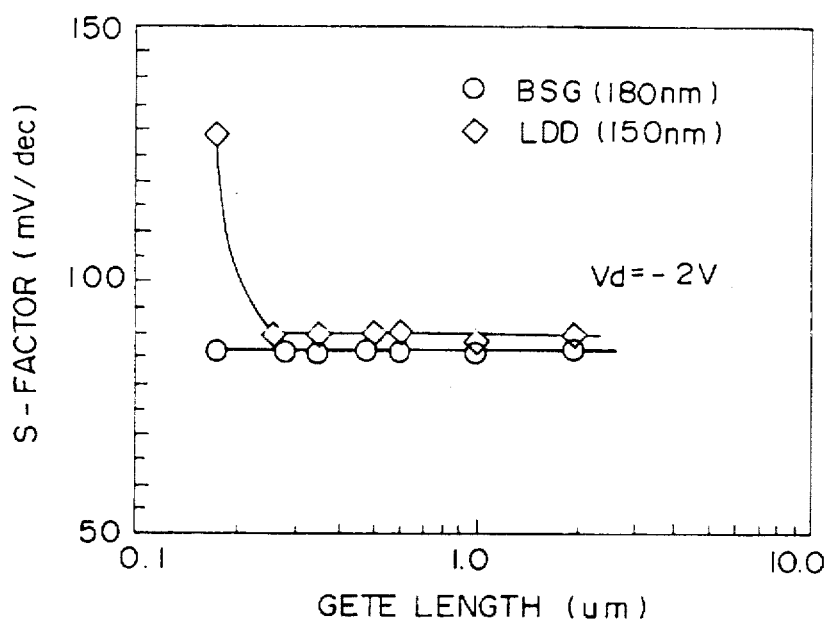
FIG. 22 is a graph showing a gate length dependency of the S-factor.
Figure 23:
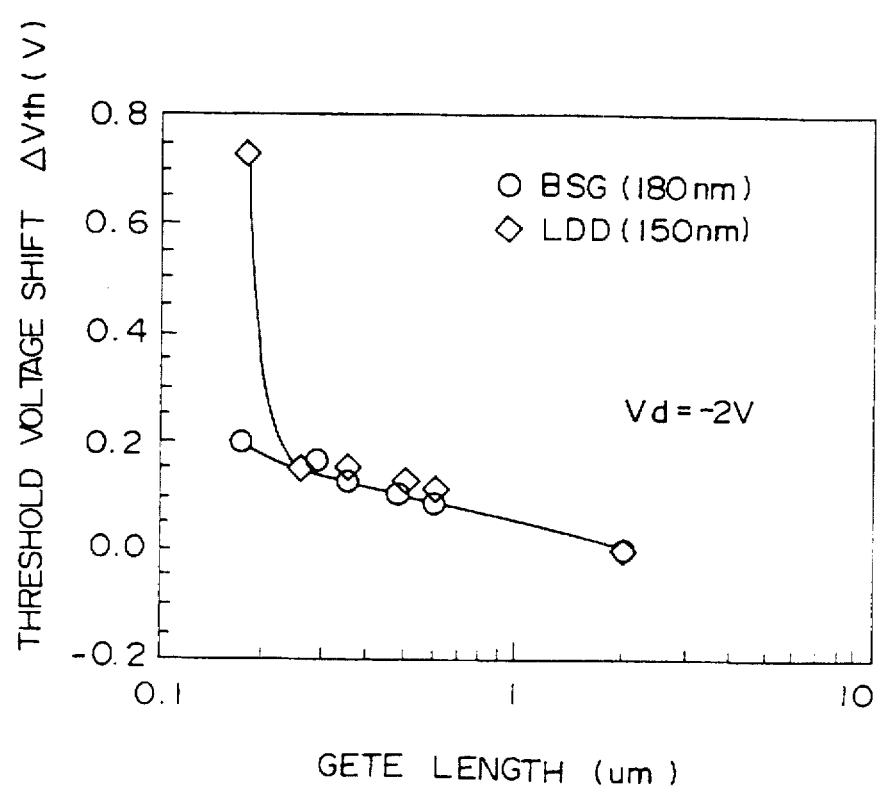
FIG. 23 is a graph showing a gate length dependency of the threshold shift quantity ΔVth.

The gate length dependency of S-factor is shown in FIG. 22, and the gate length dependency of the threshold voltage shift quantity ΔVth when the drain voltage is −2 volts is shown in FIG. 23. With respect to the LDD structure, ΔVth and S-factor increase at the gate length of 0.15 μm. In contrast, it is seen that an employment of the structure (BSG) of this invention can substantially completely suppress the short-channel effect. From this fact, it is considered that Xj of the low concentration diffused layer by the solid phase diffusion from the boron silicate glass side wall is formed considerably shallower.

The evaluated result relating to the hot carrier characteristic is now indicated below.

Figure 24A:
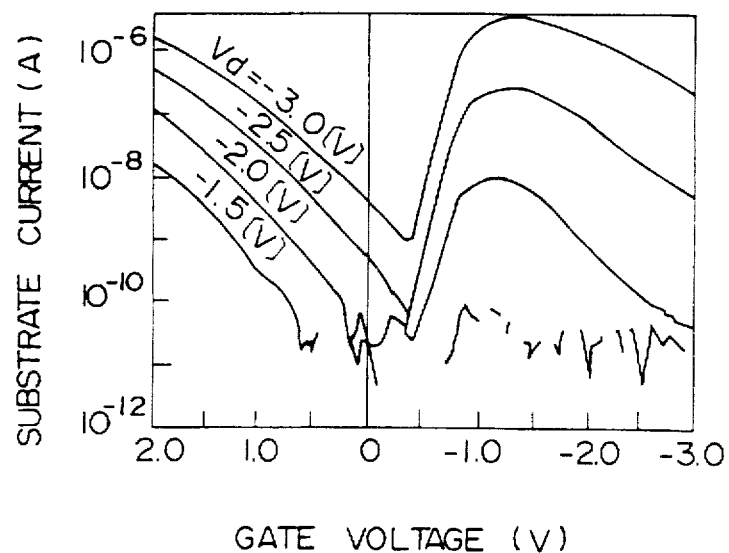
FIGS. 24A and 24B are graphs each showing the gate voltage dependency of a substrate current.
Figure 24B:
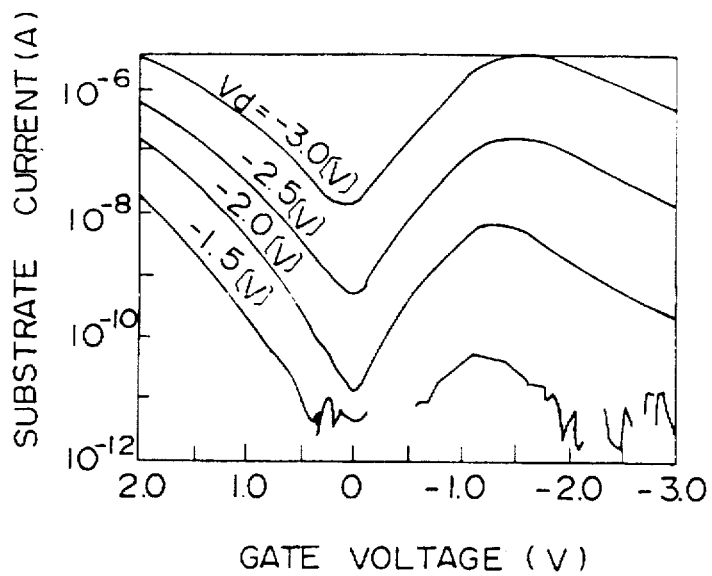

The gate voltage dependency of a substrate current with respect to the structure of this invention in which the boron silicate glass side walls having a width of 1000 angstroms are formed is shown in FIG. 24A, and the gate voltage dependency of a substrate current with respect to an ordinary LDD structure is shown in FIG. 24B. Here, the substrate current is defined as a flow into the substrate of electrons occurring at the time of impact ionization in a high electric field region in the vicinity of the drain. The LDD structure has a substrate current greater by one order than that of the structure of this invention, and has a relatively small gate voltage dependency.

Figure 25A:
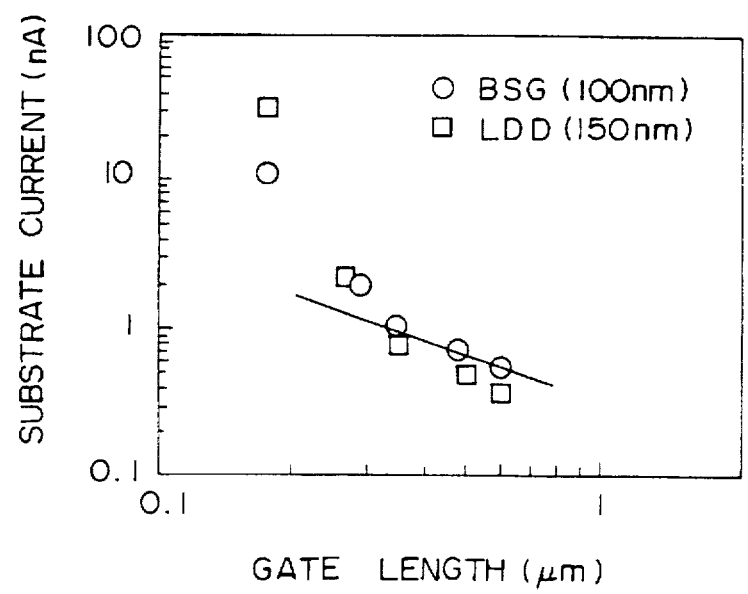
FIG. 25A is a graph showing the gate length dependency of a substrate current when the drain voltage current is fixed.
Figure 25B:
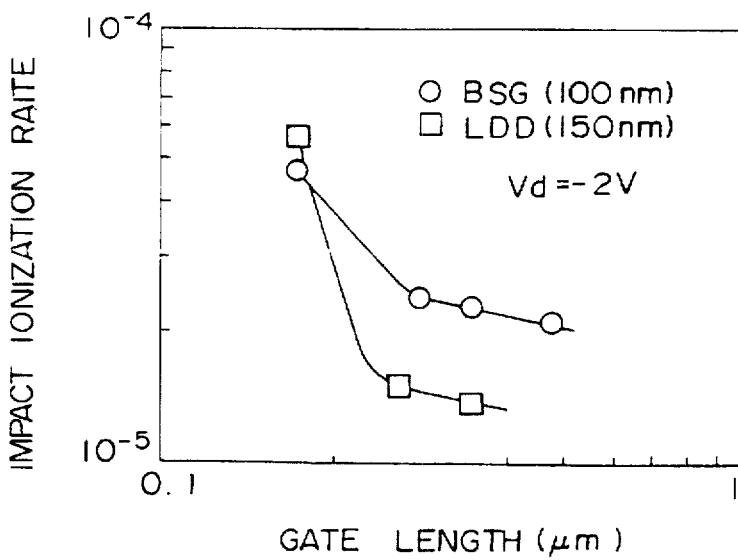
FIG. 25B is a graph showing a gate length dependency of an ion impact ionization rate.

The gate length dependency of a substrate current when the drain voltage is set to −2 volts is shown in FIG. 25A, and the gate length dependency of the impact ionization factor is shown in FIG. 25B. It is seen from these figures that according as the gate length becomes shorter, the impact ionization factor and the substrate current abruptly increase by an increase in the electric field strength at the drain end. When comparison between a substrate current in the case of a gate length of 0.25 μm and a substrate current in the case of a gate length of 0.15 μm is made, a substrate current increases about five times in the case of the structure of this invention and a substrate current increases about twenty times in the case of the LDD structure.

An example of a shift of the threshold voltage Vth after undergoing application of a stress for 100 seconds at a drain voltage of −3.5 volts is shown in FIG. 26. In the structure of this invention (BSG (100 nm)), the shift of the threshold voltage Vth indicates a positive broad peak in a range from the gate voltage of −0.5 volts to the gate voltage where the gate current takes a maximum value, i.e., electrons are injected into the gate. Further, it is seen that, in the region where the gate voltage is more than −1.3 volts, i.e., the gate current indicates flow into the gate of positive holes, the shift of the threshold voltage Vth indicates a negative value. If an interpretation is employed such that Vth is shifted as the result of the fact that carries are trapped into the gate film at the same time of injection of carriers into the gate, the above-mentioned phenomenon can be understood. A shift of Vth in the LDD structure is greater than that in the structure of this invention in a measurement range. Further, it is seen that even if the gate voltage is positive, i.e., the MOSFET is in an OFF state, any shift of Vth takes place, resulting in a deteriorated threshold voltage. It is considered that such a phenomenon results from an off-leakage current, i.e., injection of electrons into the gate produced in the overlap region of the drain.

The gate voltage dependency of a change in a charge pumping current is shown in FIG. 27. The stress condition is the same as the measurement condition of FIG. 26. As apparent from FIG. 27, a charge pumping current varies to a large degree at a gate voltage of more than −1.2 volts, i.e., at a gate voltage where the gate current takes a negative value (injection of positive holes into the gate takes place), and the shift of Vth indicates a negative value. This indicates that many traps are formed at the interface between the substrate and the gate film under the condition where positive holes generated by impact ionization are injected into the gate, i.e., traps are formed by injection into the gate of positive holes. Further, the negative shift of Vth suggests the effect of trapping of the positive holes into the gate film and the surface potential. In addition, it is observed that the surface potential increases in the OFF region. It is considered that such a phenomenon takes place by a mode (injection of electrons into the gate) similar to that of the deterioration of Vth.

Figure 28A:
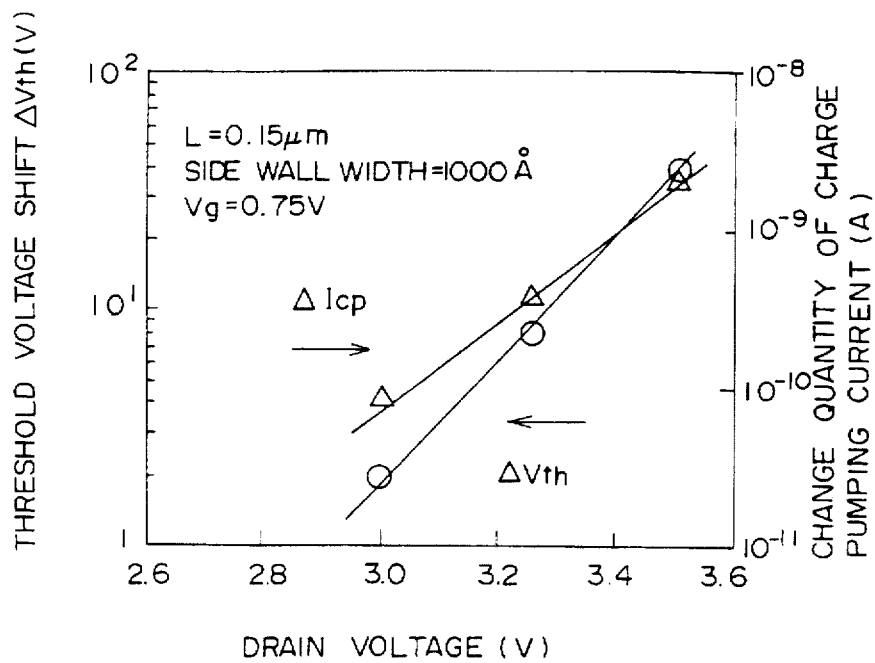
FIG. 28A is a graph showing a drain voltage dependency at stress application of a shift of the threshold voltage Vth and a change of a charge pumping current.
Figure 28B:
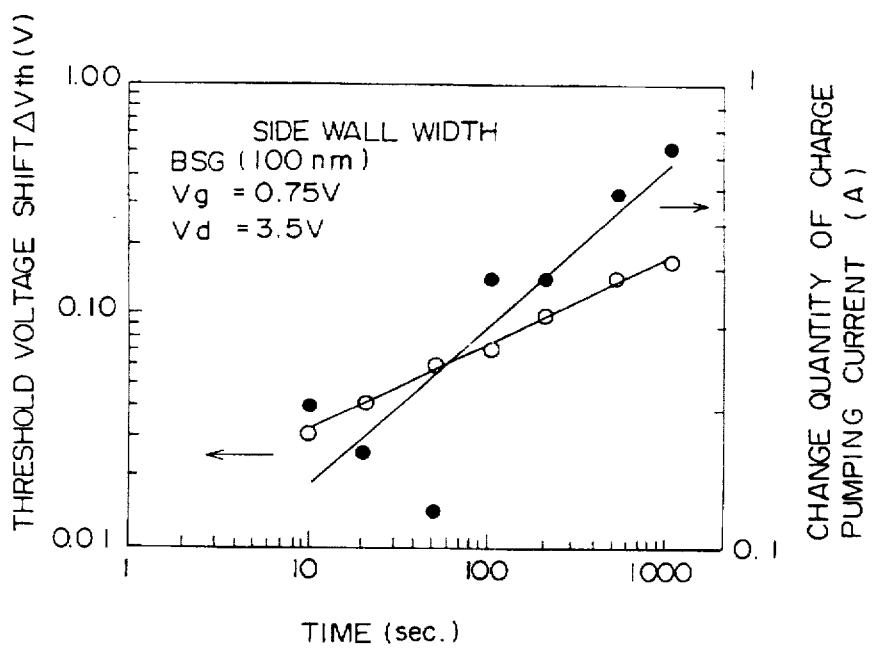
FIG. 28B is a graph showing a stress time dependency of the threshold voltage Vth.

In the actual device characteristic, the condition where the shift of Vth is negative is important. Under this recognition, prediction of the life time of the device was conducted. The drain voltage dependency of a shift of Vth and a change of a charge pumping current are shown in FIG. 28A, and the stress time dependency is shown in FIG. 28B. In these figures, the gate voltage is a voltage when the shift of Vth indicates the peak. The stress time in FIG. 28A is 1000 seconds, and the drain voltage in FIG. 28B is −3.5 volts. Both characteristics indicate a dependency of power as fitted. It is observed that the shift of the threshold voltage Vth was 20 mV for ten years in the prior art, whereas the shift of the threshold voltage Vth was about 3.4 mV for ten years in this invention.

[Second Embodiment]

A method of manufacturing a FET according to a second invention will now be described with reference to FIGS. 29A–29K.

Figure 29A:
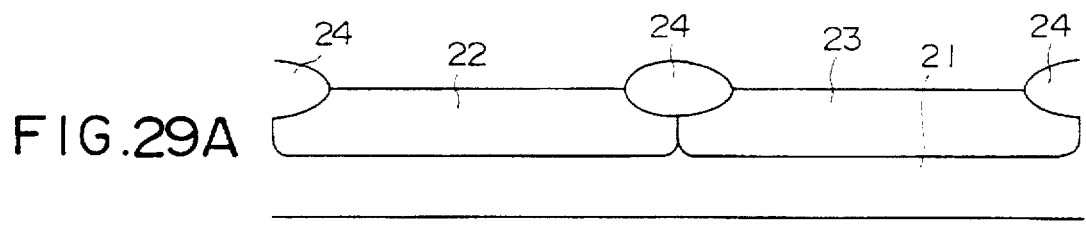
FIGS. 29A–29K are device cross sectional views of every process step showing a method of manufacturing a FET according to this invention.

First, as shown in FIG. 29A, e.g., B ions are implanted into a P well formation region of a P-type silicon substrate 21 under the condition of an acceleration voltage of 100 KeV and a dose of $2.0 \times 10^{13}$ cm$^{-2}$ thereafter to implant, e.g., P ions into an N well formation region under the condition of an acceleration voltage of 160 KeV and a dose of $6.4 \times 10^{12}$ cm$^{-2}$ thereafter to undergo heat process of 1190° C. and 150 minutes to thereby form a P well region 22 and an N well region 23. Subsequently, a device isolation region 24 is formed by the LOCOS process.

Figure 29B:
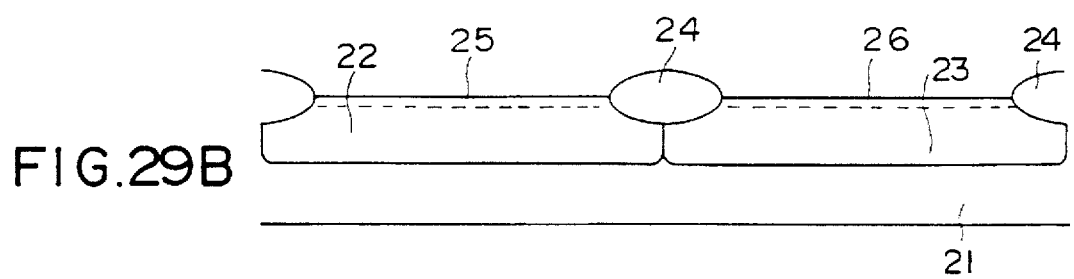

Then, as shown in FIG. 29B, e.g., B ions 25 are first implanted into the P well region 22 under the condition of an acceleration voltage of 15 eV and a dose of $1.0 \times 10^{13}$ cm$^{-2}$ for the purpose of obtaining a desired threshold voltage to thereby adjust the concentration of the channel surface thereafter to implant, e.g., P ions 26 into the N well region 23 under the condition of an acceleration voltage of 120 KeV and a dose of $1.0 \times 10^{13}$ cm$^{-2}$ for the purpose of obtaining a desired threshold voltage to subsequently implant As ions 26 under the condition of an acceleration voltage of 40 KeV and a dose of $2.5 \times 10^{13}$ cm$^{-2}$ to thereby adjust the concentration of the channel surface.

Figure 29C:
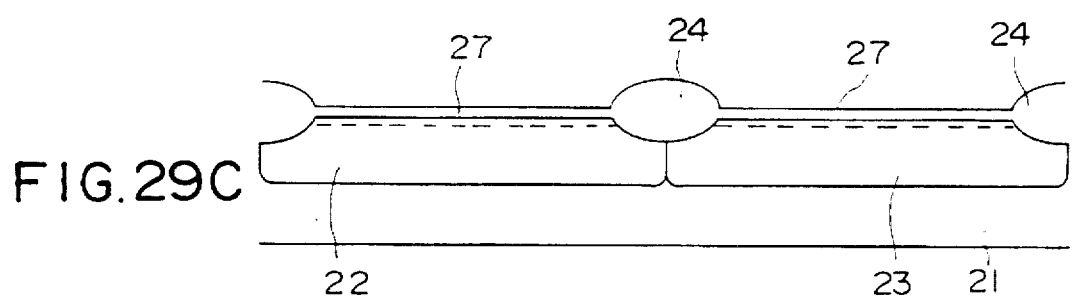

As shown in FIG. 29C, the surface of the silicon substrate 21 is then oxidized, e.g., in the atmosphere of 10% HCl oxygen at 750° C. to thereby form an oxide film 27 having a thickness of 4 nm.

Figure 29D:
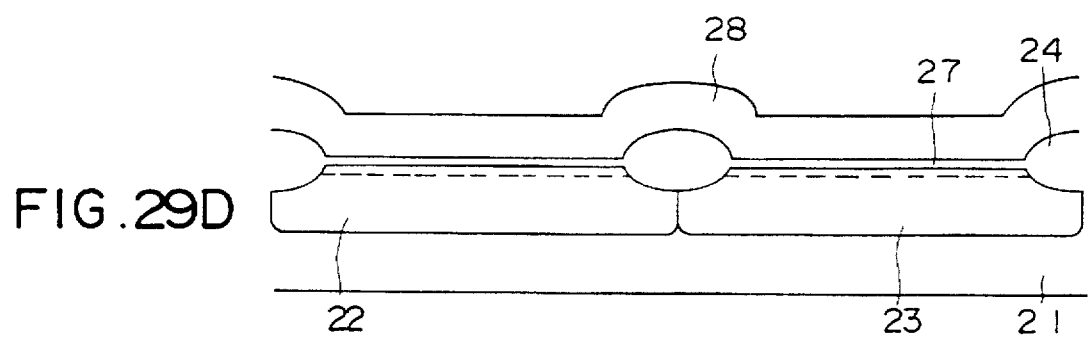

Next, as shown in FIG. 29D, a polysilicon film 28 having a thickness of 200 nm is deposited on the silicon oxide film 27, e.g., by the LPCVD process. Thereafter, e.g., As ions are implanted into the N-channel FET region under the condition of an acceleration voltage of 40 KeV and a dose of $3.0 \times 10^{15}$ cm$^{-2}$ to implant, e.g., BF$_2$ ions into the P-channel FET region under the condition of an acceleration voltage of 35 KeV and a dose of $1.0 \times 10^{15}$ cm$^{-2}$.

Figure 29E:
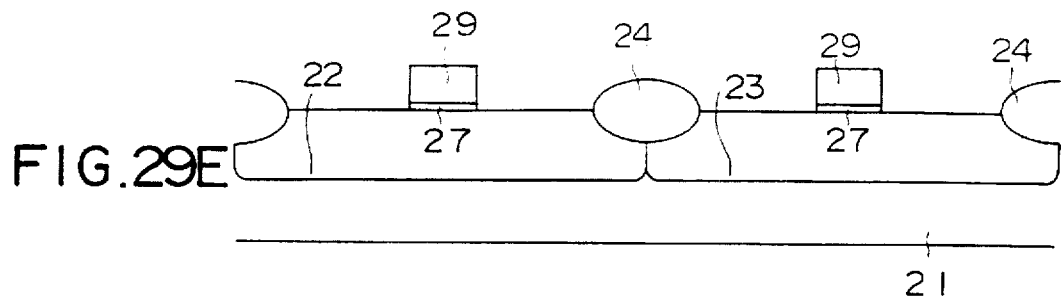

As shown in FIG. 29E, the polysilicon film 28 is then etched, e.g., by the RIE process to form gate electrodes 29.

Figure 29F:
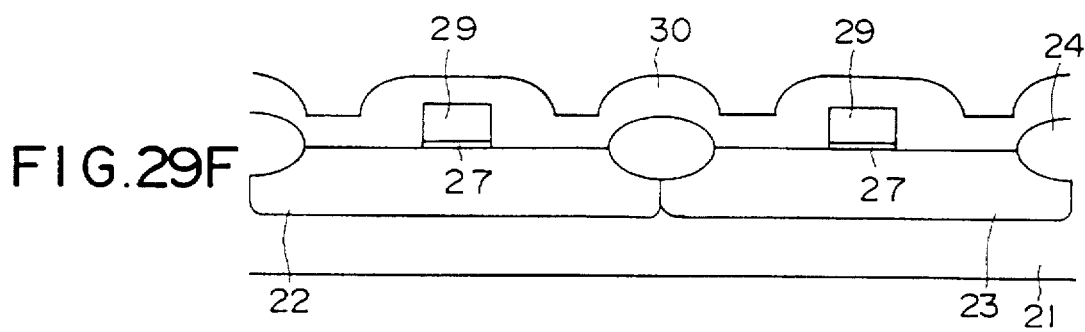

Then as shown in FIG. 29F, a BPSG 30 having a thickness of 100 nm is deposited on the entire surface of the silicon substrate 21, e.g., by the LPCVD process.

Figure 29G:
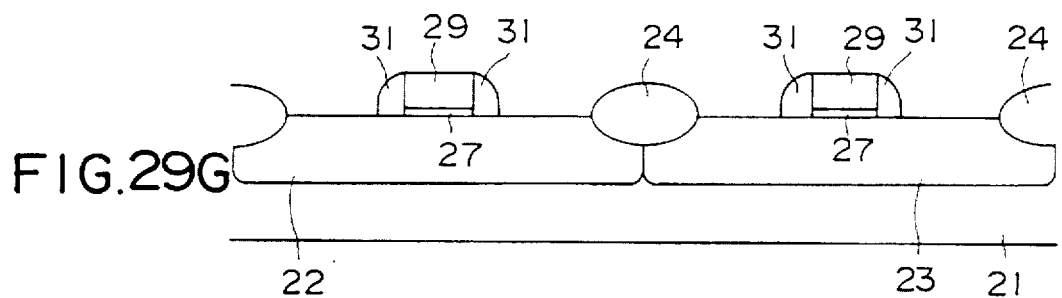

As shown in FIG. 29G, anisotropic etching, e.g., RIE process, etc. is then implemented to thereby form BPSG side walls 31.

Figure 29H:
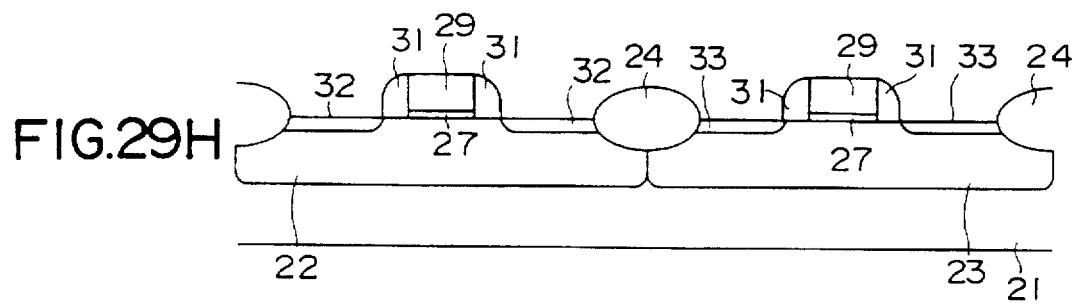

Next, as shown in FIG. 29H, e.g., As ions 32 are implanted into the source and drain formation regions of the N-channel FET under the condition of an acceleration voltage of 50 Kev and a dose of $5.0 \times 10^{15}$ cm$^{-2}$. Then, e.g., BF$_2$ ions 33 are implanted into the source and drain formation regions of the P-channel FET under the condition of an acceleration voltage of 35 eV and a dose of $3.0 \times 10^{15}$ cm$^{-2}$.

Figure 29I:
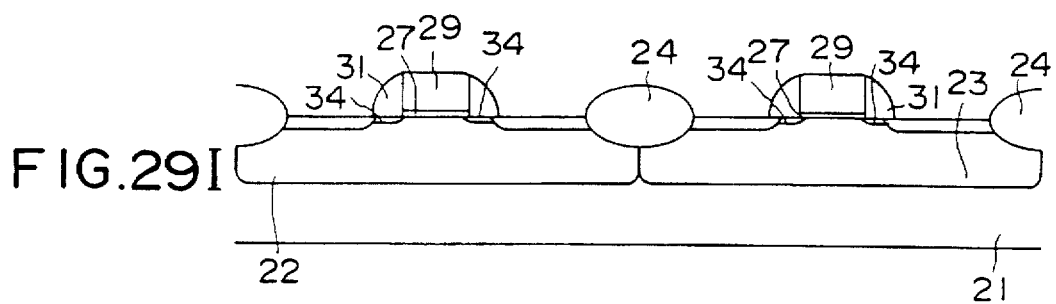

Thereafter, as shown in FIG. 29I, e.g., a heat process of 950° C. and 10 seconds is applied to thereby activate the As ions and the BF$_2$ ions implanted in the former process steps, and to allow B ions and P ions 34 to be diffused into the regions below the side walls by solid phase diffusion. At this time, the concentration of B ions in the BPSG is higher than the concentration of P ions, whereby the concentration of B ions higher than the concentration of P ions is obtained in the region below the side walls.

Figure 29J:
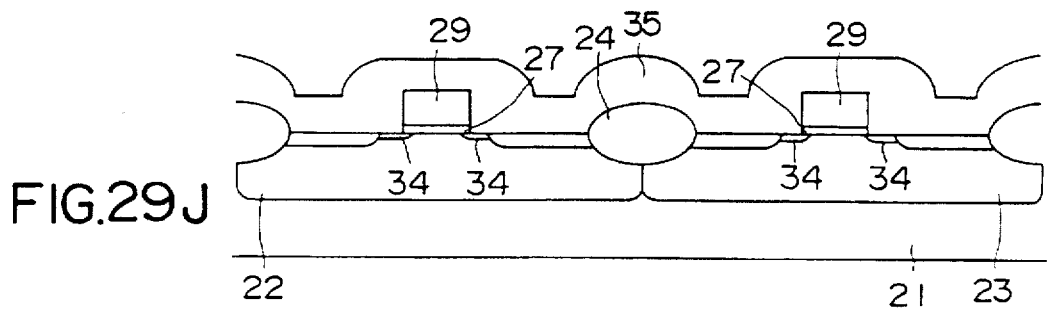

Then, as shown in FIG. 29J, e.g., a treatment of the dilute hydrofluoric acid system is first implemented to thereby peel off the BPSG side walls 31. Thereafter, an oxide silicon 35 having a thickness of 100 nm is deposited on the entire surface of the silicon substrate, e.g., by the LPCVD process.

Figure 29K:
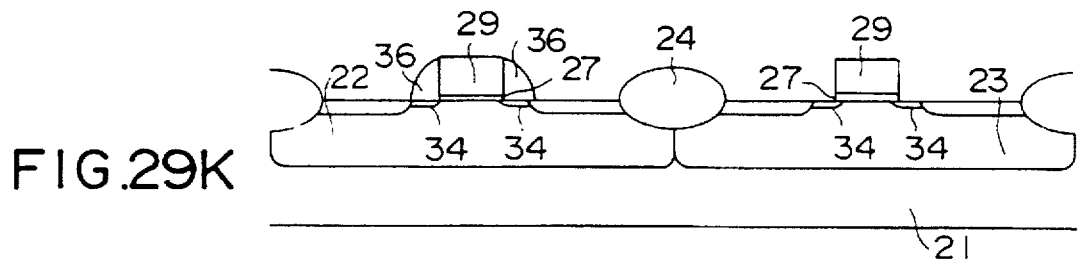

Then, as shown in FIG. 29K, anisotropic etching, e.g., RIE process, etc. is implemented to form oxide silicon side walls 36 only on the n-channel region and a treatment of e.g. dilute hydrofluoric acid system is implemented to thereby peel off the oxide silicon 35 only in the P-channel FET region.

Then, e.g., heat process of 950° C. and 10 seconds is applied. Here, the ratio between the concentration of B and P ions in the silicon oxide side walls 36 of the N-channel FET and the concentration of B and P ions in the substrate is determined by the segregation factor. In the case where two kinds of media A and B exist in a contact manner and a third material C is dissolved in the media A and B, in the thermal equilibrium state, the ratio between the concentration of C on the A side at the boundary surface between A and B and the concentration of C on the B side at the boundary surface between A and B is a constant value. This constant value is called a segregation factor. In accordance with an experiment, the segregation factor of P is about 10, and the segregation factor of B is about 0.3. Accordingly, B ions are drawn out by the heat process at the portions below the oxide silicon side walls 36 of the N-channel FET region, so the concentration of B ions is higher than that of P ions.

At times subsequent thereto, after undergoing an interconnection process, etc. in a manner similar to that of manufacturing of a conventional semiconductor device, a semiconductor device is constituted.

While, in the above-mentioned process, the BPSG side walls of the N-channel FET region and the P-channel FET region are peeled off by the treatment of the dilute hydrofluoric acid system, process steps subsequent thereto may be carried out while the BPSG side walls of the P-channel FET region are left as they are.

In this instance, in carrying out heat process to draw out B ions in the N-channel FET region from the silicon oxide side walls, B ions can be diffused at the same time from the BPSG side walls in the p-channel FET region.

[Third Embodiment]

By a process similar to that of the second embodiment, gate electrodes are formed within the P well formation region and the n well formation region of the silicon substrate 21.

Figure 30A:
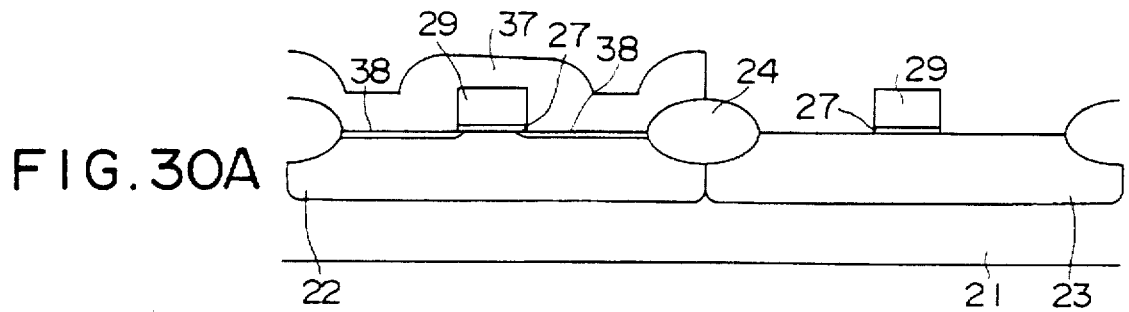
FIGS. 30A–30D are device cross sectional views of every process step showing a method of manufacturing a FET according to this invention.

Then, as shown in FIG. 30A, an AsSG film 37 having a thickness of 100 nm is formed, e.g., by the LPCVD process on the silicon substrate 21.

Thereafter, e.g., a treatment of the dilute hydrofuoric acid system is implemented to thereby remove the AsSG film 37 only in the P-channel FET region.

Then, e.g., a heat process of 950° C. and 10 minutes is applied to thereby allow As to be diffused from the AsSG 37, to form diffused regions 38.

Figure 30B:
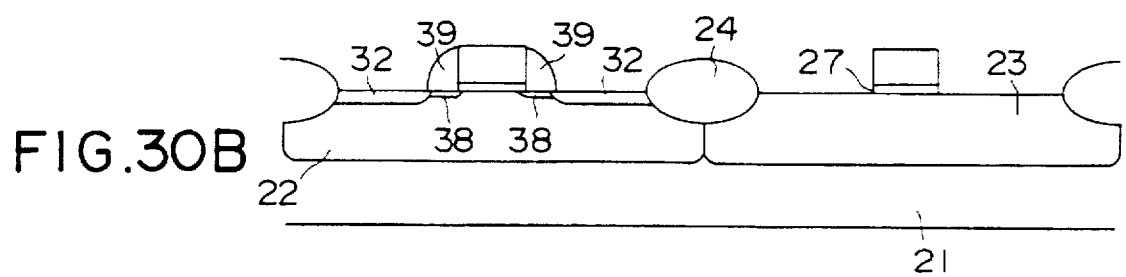

Then, as shown in FIG. 30B, an anisotropic etching, e.g., RIE process, etc. is implemented to the AsSG film 37 to thereby form AsSG side walls 39. Thereafter, e.g., As ions 32 are implanted into the N-channel FET region under the condition of an acceleration voltage of 30 KeV and a dose of $5.0 \times 10^{15}$ cm$^{-2}$.

It is to be noted that similar result may be obtained by forming AsSG side walls thereafter to diffuse As ions into the N-channel FET region.

Figure 30C:
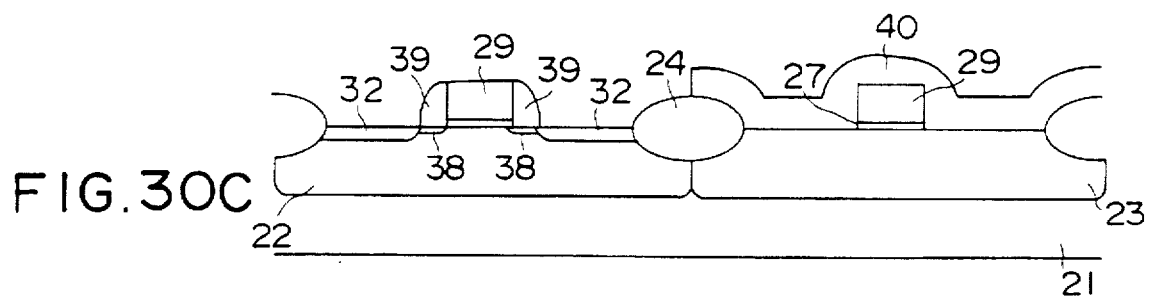

Then, a BSG film 40 having a thickness of 100 nm is formed, e.g., by the LPCVD process on the silicon substrate. Thereafter, e.g., a treatment of the dilute hydrofluoric system is implemented to thereby remove the BSG film 40 only in the N-channel FET region (FIG. 30C).

Figure 30D:
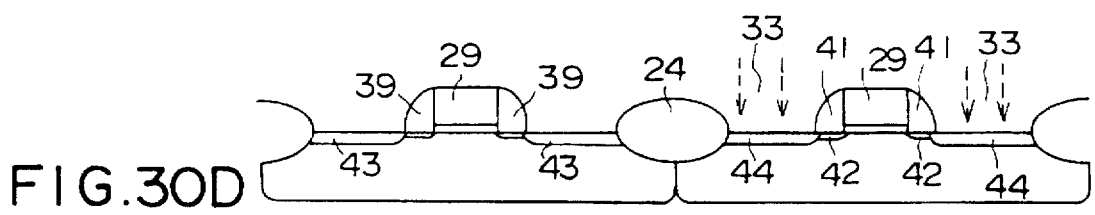

Then, as shown in FIG. 30D, an anisotropic etching, e.g., RIE process, etc. is implemented to the BSG film 40 to thereby form BSG side walls 41. Thereafter, e.g., BF2 ions 33 are implanted into the P-channel FET region under the condition of an acceleration voltage of 35 keV and a dose of $5.0 \times 10^{15}$ cm$^{-2}$. For example, a heat process of 1000° C. and 10 seconds is applied to thereby allow B ions 42 to be diffused from the BSG side walls, and to activate implanted impurity to form N-type diffused layers 43 and P-type diffused layers 44.

At times subsequent thereto, after undergoing an interconnection process, etc. in a manner similar to that of the conventional semiconductor device, a semiconductor device is constituted.

It is to be noted that similar result may be obtained in the case where BSG film 40 in N channel region is not removed.

[Fourth Embodiment]

By a process similar to that of FIGS. 29A–29E of the second embodiment, gate electrodes are formed within the P well formation region and the n well formation region of the silicon substrate 21.

Figure 31A:
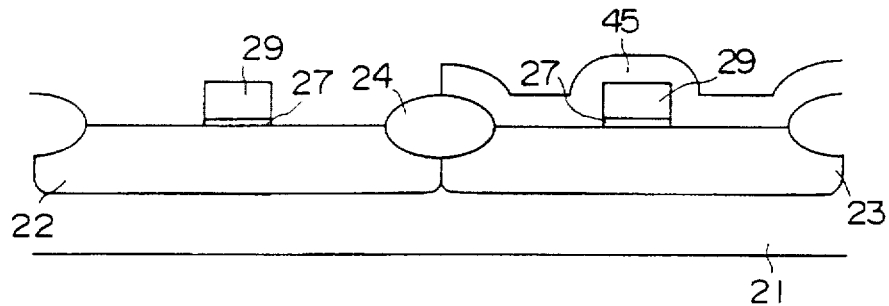
FIGS. 31A–31D are device cross sectional views of every process step showing a method of manufacturing a FET according to this invention.

Then, as shown in FIG. 31A, a silicon nitride film 45 having a thickness of 100 nm is formed, e.g., by the LPCVD process on the silicon substrate 21. For example, a hot phosphoric acid treatment is implemented thereto to thereby remove the silicon nitride film 45 only in the N-channel FET region.

Then, an AsSG film 37 having a thickness of 100 nm is formed, e.g., by the LPCVD process on the silicon substrate 21. For example, a treatment of the dilute hydrofluoric acid system is implemented thereto to thereby remove the AsSG film 37 only in the P-channel FET region. Then, e.g., a heat process of 950° C. and 10 minutes is applied to thereby allow As ions 38 to be diffused from AsSG film to form As diffused regions 38.

Then, an anisotropic etching, e.g., RIE process, etc. is implemented to the AsSG film 37 to thereby form AsSG side walls 39.

It is to be noted that similar effect may be obtained by forming AsSG side walls thereafter to diffuse As ions into the N-channel FET region.

Then, e.g., As ions are implanted into the N-channel FET region with the side walls being as a mask under the condition of an acceleration voltage of 30 KeV and a dose of $5.0 \times 10^{15}$ cm$^{-2}$ to form As implanted regions 32.

Figure 31B:
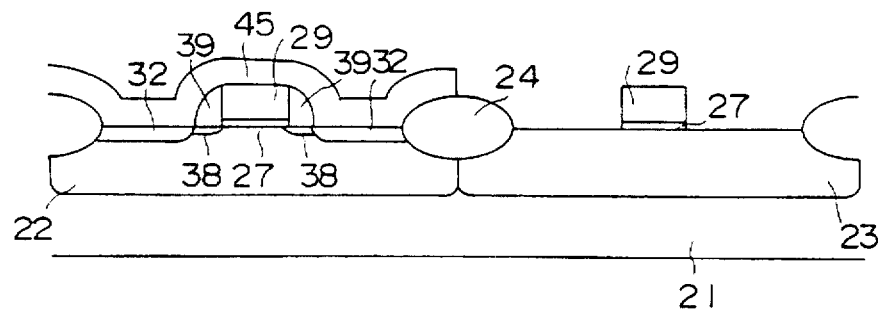
Figure 31C:
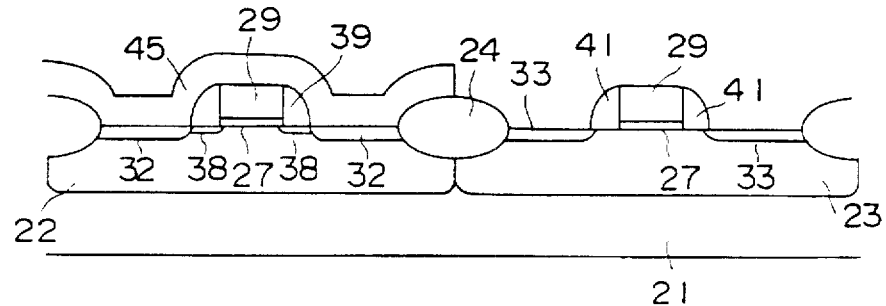

Then, e.g., a hot phosphoric acid treatment is implemented to thereby remove the silicon nitride film 45 on the P-channel FET region. Then, a silicon nitride film having a thickness of 100 nm is formed again, e.g., by the LPCVD process on the silicon substrate to implement, e.g., hot phosphoric acid treatment thereto to thereby remove the silicon nitride film 45 only in the P-channel FET region (FIG. 31B).

Then, a BSG film 40 having a thickness of 100 nm is formed, e.g., by the LPCVD process on the silicon substrate 21. For example, a treatment of the dilute hydrofluoric acid system is implemented to thereby remove the BSG film 40 only in the N-channel FET region.

Thereafter, an anisotropic etching, e.g., RIE process, etc. is implemented to the BSG film 40 to thereby form BSG side walls 41. Then, e.g., BF$_2$ ions are implanted into the P-channel FET region under the condition of an acceleration voltage of 35 KeV and a dose of $5.0 \times 10^{15}$ cm$^{-2}$ to form ion implanted regions.

Figure 31D:
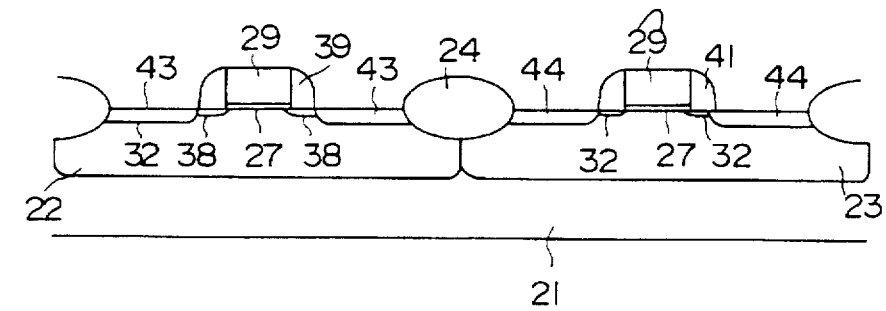

The process step shown in FIG. 31D is then carried out. For example, a hot phosphoric acid treatment is implemented to thereby remove the silicon nitride film 45 on the N-channel FET region. Subsequently, e.g., a heat process of 1000° C. and 10 seconds is applied, to thereby allow B ions to be diffused from the BSG side walls, and to activate implanted impurity, thus to form N-type diffused layers 43 and P-type diffused layers 44.

At times subsequent thereto, after undergoing an interconnection process step, etc. in a manner similar to manufacturing of a conventional semiconductor device, a semiconductor device is constituted.

In the third and fourth embodiments, side walls of the N-channel FET region are formed thereafter to implant impurity into the N-channel FET region thereafter to subsequently form side walls of the P-channel FET region. It is needles to say that similar effect may be provided by forming side walls of the both P and N channel FET transistor regions to respectively implant impurity into the both FET transistor regions.

[Fifth Embodiment]

By a process similar to that of FIGS. 29A–29E of the above-mentioned second embodiment, gate electrodes are formed within the P well formation region and the n well formation region of the silicon substrate 21.

Then, a silicon nitride film 45 having a thickness of 100 nm is formed, e.g., by the LPCVD process on the silicon substrate. For example, hot phosphoric acid treatment is then implemented to thereby remove the silicon nitride film 45 only in the N-channel FET region.

Figure 32A:
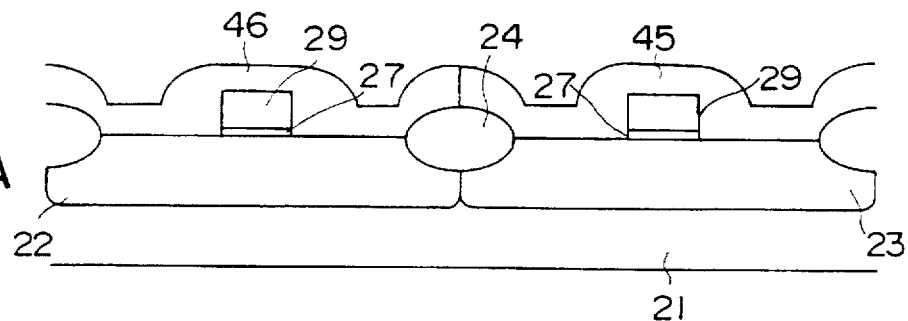
FIGS. 32A–32E are device cross sectional views of every process step showing a method of manufacturing a FET according to this invention.

Then, a PSG film 46 having a thickness of 100 nm is formed, e.g., by the LPCVD process on the silicon substrate 21. For example, treatment of the dilute hydrofluoric system is then implemented to thereby remove the PSG film 46 only in the p-channel FET region (FIG. 32A).

Figure 32B:
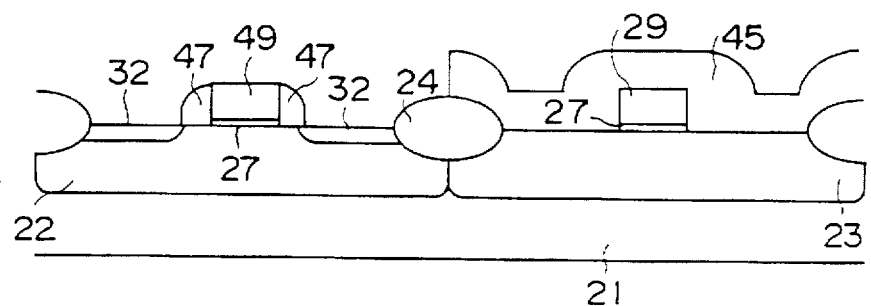

Then, an anisotropic etching, e.g., RIE process, etc. is implemented to the PSG film 46 to thereby form a PSG side walls 47. Thereafter, e.g., As ions are implanted into the N-channel FET region under the condition of an acceleration voltage of 30 KeV and a dose of $5.0 \times 10^{15}$ cm$^{-2}$ (FIG. 32B).

Figure 32C:
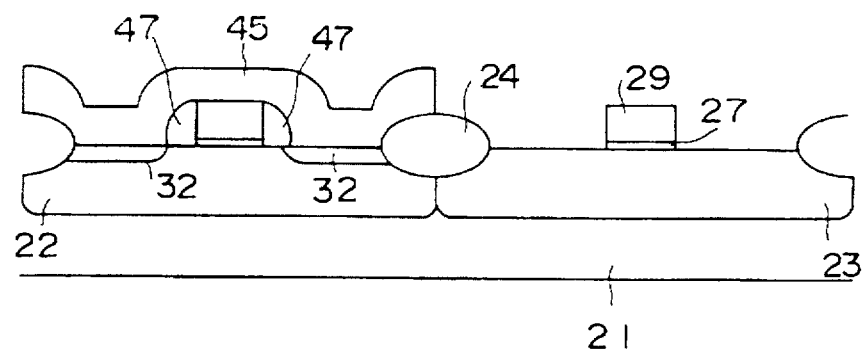

Then, e.g., hot phosphoric acid treatment is implemented to the silicon nitride film 45 on the P-channel FET region to remove it. Subsequently, a silicon nitride film 45 having a thickness of 100 nm is formed, e.g., by the LPCVD process on the substrate. For example, hot phosphoric acid treatment is then implemented to thereby peel off the silicon nitride film 45 only in the P-channel FET region (FIG. 32C).

Figure 32D:
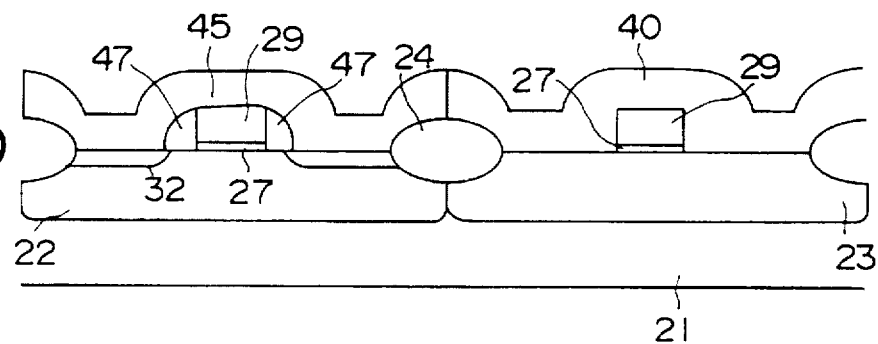

Then, a BSG film 40 having a thickness of 100 nm is formed, e.g., by the LPCVD process on the silicon substrate 21. For example, a treatment of the dilute hydrofluoric acid system is implemented to thereby remove the BSG film 40 only in the N-channel FET region (FIG. 32D).

Figure 32E:
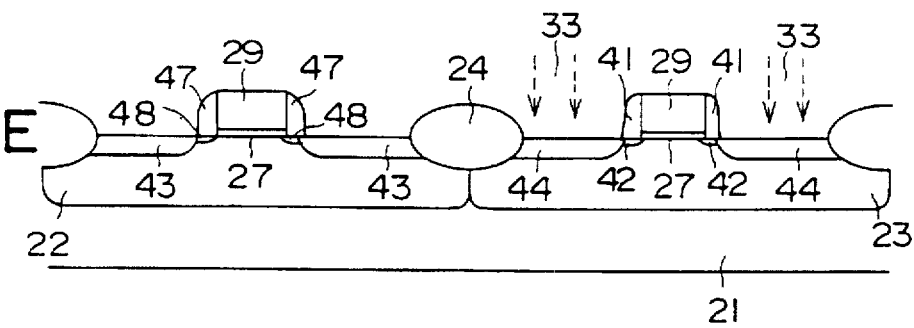

Then, an anisotropic etching, e.g., RIE process, etc. is implemented to the BSG film 40 to thereby form BSG side walls 41. Then, e.g., hot phosphoric acid treatment is implemented to the silicon nitride film 46 on the N-channel FET region to remove it. Thereafter, e.g., $BF_2$ ions 33 are implanted into the P-channel FET region under the condition of an acceleration voltage of 35 KeV and a dose of $5.0 \times 10^{15}$ $cm^{-2}$. For example, a heat process of 1000° C. and 10 seconds is applied to thereby allow respective P ions and B ions to be diffused from the PSG side walls 47 and BSG side walls 41 to form P diffused regions 42 and B diffused regions 48, and to activate implanted impurity, thus to form N-type diffused layers 43 and P-type diffused layers 44 (FIG. 32E).

At times subsequent thereto, after undergoing an interconnection process, etc. in a manner similar to that of manufacturing of a conventional semiconductor device, a semiconductor device is constituted.

It is to be noted that while, in the above-mentioned fifth embodiment, side walls of the N-channel FET region are formed thereafter to form side walls of the p-channel FET region, it is needless to say that similar effect may be obtained even if the order of forming side walls is opposite.

[Sixth Embodiment]

By a process similar to that of the fifth embodiment, as shown in FIG. 32A, a PSG film 46 is formed on the N-channel FET region and a silicon nitride film 45 is formed on the P-channel FET region.

Figure 33A:
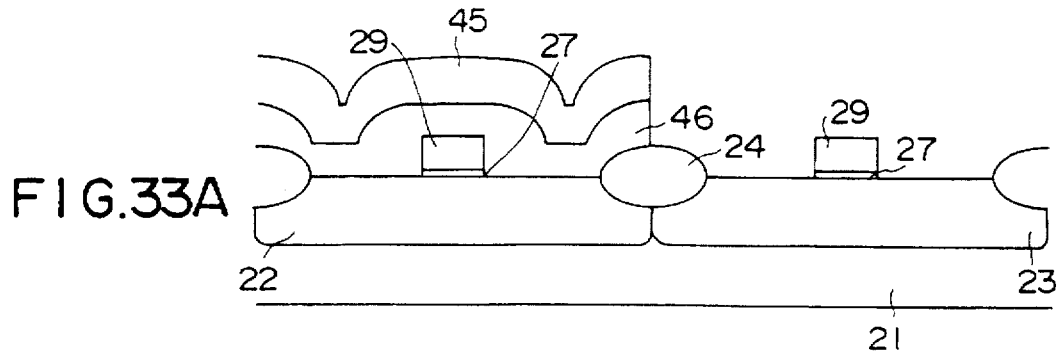
FIGS. 33A–33D are device cross sectional views of every process step showing a method of manufacturing a FET according to this invention.

Then, e.g., hot phosphoric acid treatment is implemented to the silicon nitride film 45 on the P-channel FET region to thereby remove it. Subsequently, a silicon nitride film 45 having a thickness of 100 nm is formed, e.g., by the LPCVD process on the substrate. Thereafter, e.g., hot phosphoric acid treatment is implemented to thereby peel off the silicon nitride film 45 only in the P-channel FET region (FIG. 33A).

Figure 33B:
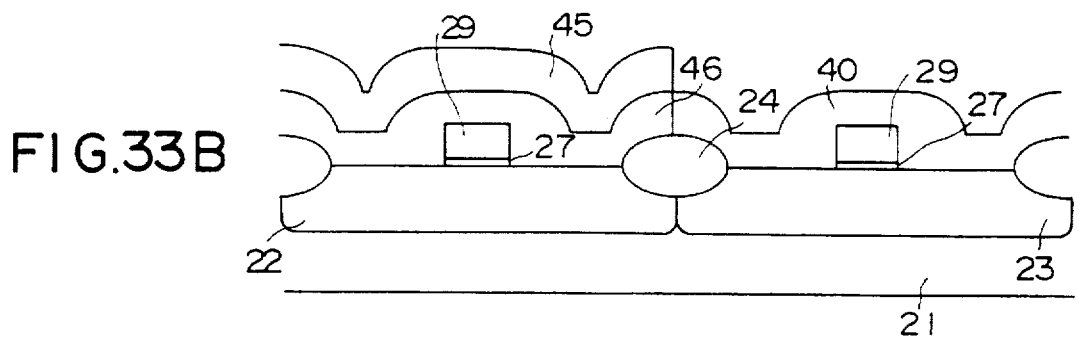
Figure 33C:
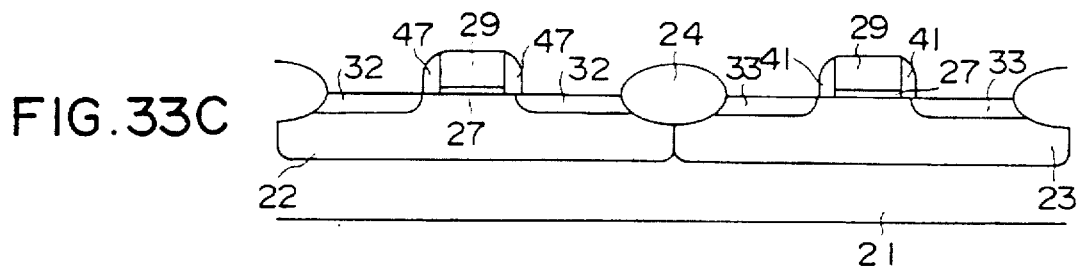

Then, a BSG film 40 having a thickness of 100 nm is formed, e.g., by the LPCVD process on the silicon substrate 21. Thereafter, e.g., a treatment of the dilute hydrofluoric acid system is implemented to thereby remove the BSG film 40 only in the N-channel FET region (FIG. 33B).

Subsequently, e.g., a hot phosphoric acid treatment is implemented to thereby peel off the silicon nitride film 45 in the N-channel FET region to implement an anisotropic etching, e.g., RIE process, etc. to the PSG film 46 and the BSG film 40 to thereby form respective PSG side walls 47 and BSG side walls 41. Thereafter, e.g., As ions are implanted into the N-channel FET region under the condition of an acceleration voltage of 30 KeV and a dose of $5.0 \times 10^{15}$ $cm^{-2}$ to form ion implanted regions 32. Subsequently, e.g., $BF_2$ ions are implanted into the P-channel FET region under the condition of an acceleration voltage of 35 KeV and a dose of $5.0 \times 10^{15}$ $cm^{-2}$ to form ion implanted regions 33.

Figure 33D:
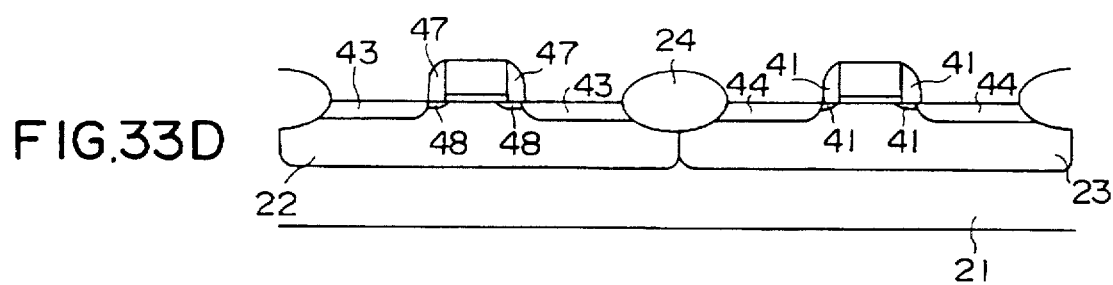

Then, the process step shown in FIG. 33D is carried out. Namely, e.g., a heat process of 1000° C. and 10 seconds is applied to thereby allow respective P ions 48 and B ions 42 to be diffused from the PSG side walls 47 and the BSG side walls 41, and to activate implanted impurity, thus to form N-type diffused layers 43 and P-type diffused layers 44.

At times subsequent thereto, after undergoing an interconnection process, etc. in a manner similar to manufacturing of a conventional semiconductor device, a semiconductor device is constituted.

While, in the above-described sixth embodiment, a PSG film is first deposited on the N-channel FET region thereafter to deposit a BSG film on the P-channel FET region, it is needless to say that similar effect may be obtained even if deposition is made in a reverse order.

Further, while, in the four embodiments of the third to the sixth embodiments, impurities are respectively implanted into the N-channel FET region and the P-channel FET region at the time of forming gate electrodes to thereby form a dual gate complementary FET, it is also needless to say that similar effect may be provided even if there is employed a method of diffusing respective P and B ions from PSG and BSG into the gate electrodes at the time of heat process for forming diffused layers without implanting impurity into the polysilicon for forming gate electrodes to thereby form a dual gate complementary FET.

In accordance with the above-described second to sixth embodiments, diffused layers of the N-channel FET transistor are formed by diffusion from AsSG, PSG and BPSG, and diffused layers of the P-channel FET are formed by diffusion from BSG and BPSG. Accordingly, diffused layers which are higher in concentration and are shallower in depth than those of a FET by the conventional method.

[Seventh Embodiment]

A seventh embodiment of this invention will now be described with reference to FIGS. 34A to 34F.

The invention in this embodiment is characterized in that one of N/P channel transistors of the CMOSFET is formed by a method including the solid-phase diffusion process, and the other is formed by using an ion implantation process, thereby making it possible to form a shallow diffused layer without increasing the number of steps.

First, e.g., B ions are implanted into a P-well formation region of a P type silicon substrate 71 under the condition of an acceleration voltage of 100 KeV and a dose of $6.4 \times 10^{12}$ $cm^{-2}$ thereafter to implant, e.g., P ions into the N well formation region under the condition of an acceleration voltage of 16 KeV and a dose of $6.4 \times 10^{12}$ $cm^2$ thereafter to undergo a heat process of 1190° C. and 15 minutes to thereby form an N well region 72 and a P well region 73.

Subsequently, a device isolation region 74 is formed by the LOCOS process.

Then, a silicon oxide film 75 is formed on the silicon substrate 71 so that its thickness is equal to 4 nm to further form a polysilicon film 76 thereon so that its thickness is equal to 200 nm.

Then, the polysilicon film 76 and the silicon oxide film 75 are etched, e.g., by the RIE process to form gate electrodes.

Figure 34A:
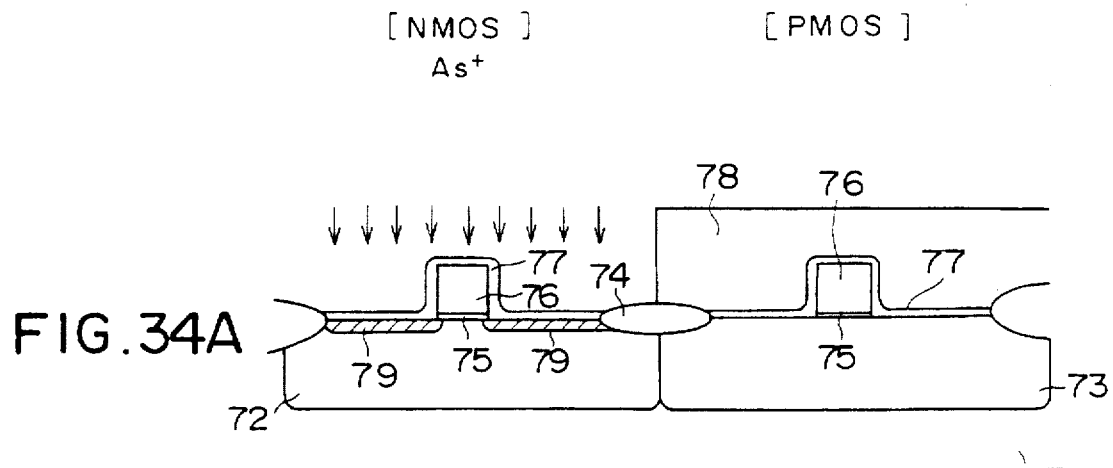
FIGS. 34A–34F are device cross sectional views of every process step showing a method of manufacturing a FET according to this invention.

Then, the entirety of the substrate is oxidized to form an oxide film 77 having a thickness of about 100 angstroms on the entire surface of the substrate. Thereafter, a resist layer 78 is formed on the P-channel FET region to implant $As^+$ ions into the N-channel FET region under the condition of an acceleration voltage of 20 KeV and a dose of $2 \times 10^{14}$ $cm^{-2}$ with the resist layer 78 being as a mask to thereby form shallow source/drain diffused layers 79 (FIG. 34A).

Figure 34B:
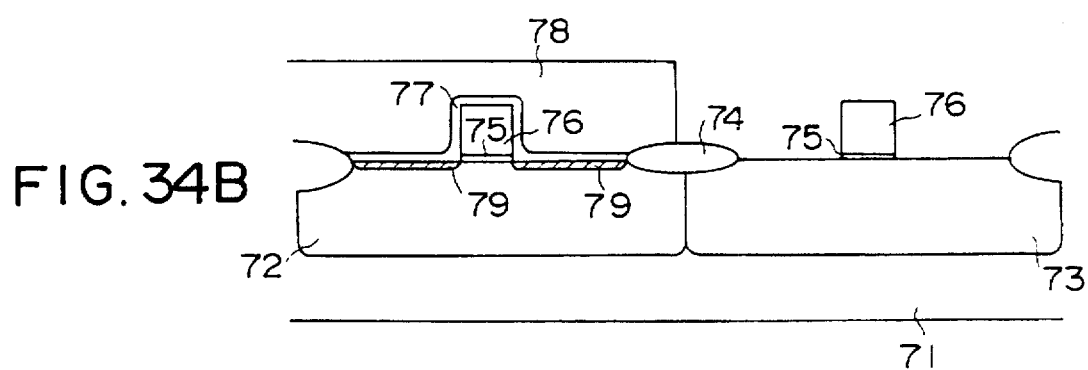

Then, a resist layer 78 is formed on the N-channel FET region to selectively peel off the oxide film 77 on the P-channel FET region (FIG. 34B).

Then, the resist layer 78 on the N-channel FET region is peeled off thereafter to form BSG films 81 having a concentration of about $5 \times 10^{21}$ $cm^{-3}$ on the entire surface of the substrate so that its thickness is equal to about 1000 angstroms to carry out an anisotropic etching such as RIE process, etc. to thereby form BSG side walls 81 on the both sides of the gate electrode.

Figure 34C:
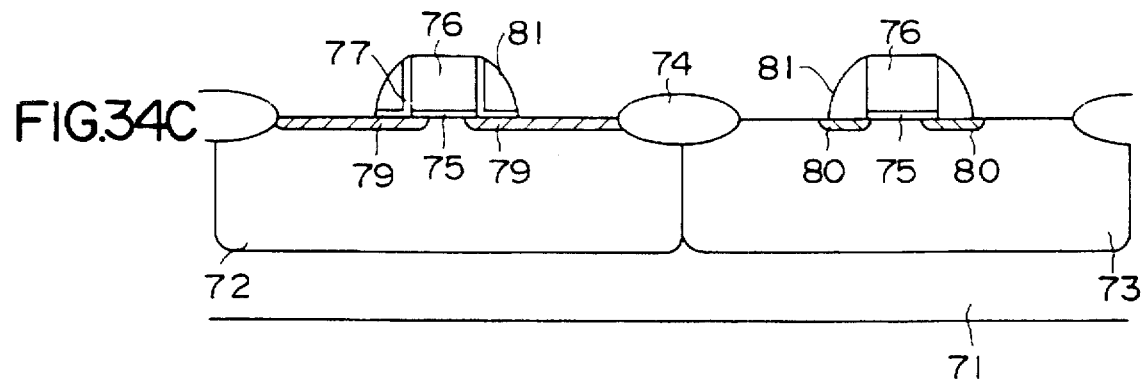

Then, a heat treatment is carried out under the condition of 1000° C. and 15 seconds to thereby allow boron to be diffused from the BSG side walls to the Si substrate only in the P-channel FET region. At this time, the oxide film serves as a stopper on the N-channel FET region so that no boron is diffused (FIG. 34C).

Figure 34D:
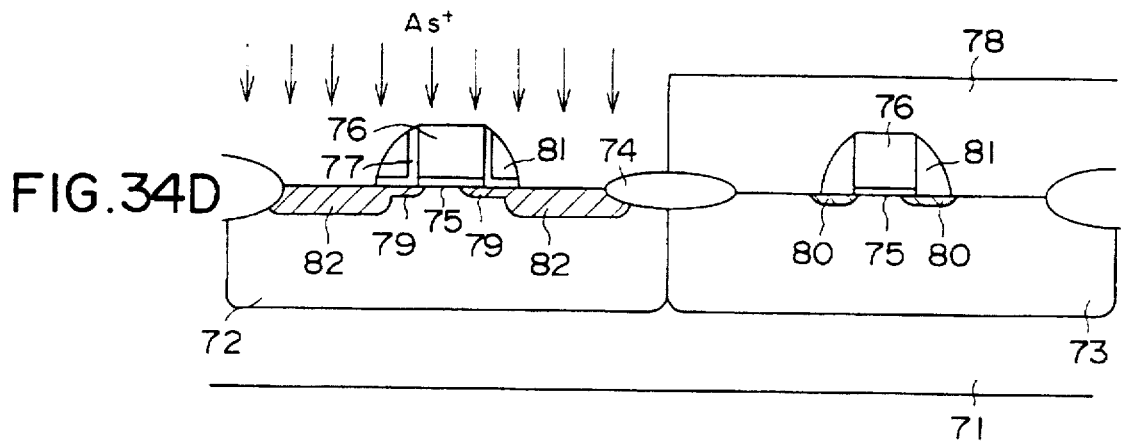

Subsequently, a resist layer 78 is formed on the P-channel FET region to implant As ions only into the N-channel FET region with the resist layer 78 being as a mask to form deep source/drain diffused layers 82 (FIG. 34D).

Figure 34E:
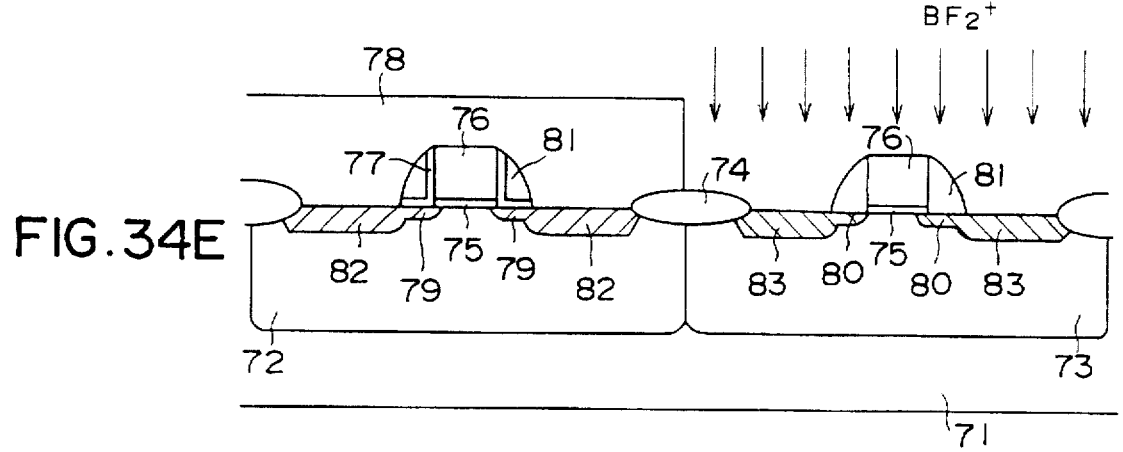

Then, a resist layer 78 is formed on the N-channel FET region to implant BF$_2$ ions only into the P-channel FET region with the resist layer 78 being as a mask to thereby deep source/drain diffused layers 83 (FIG. 34E).

Figure 34F:
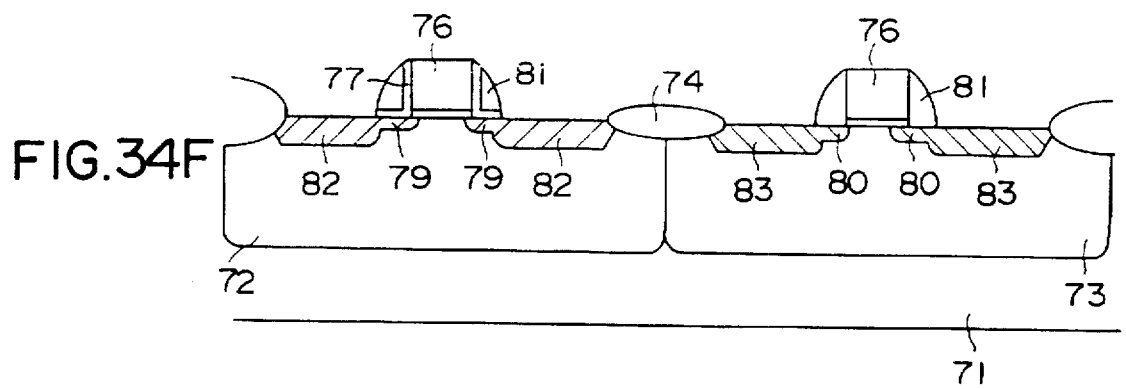

Finally, after peeling off the resist layer 78, ion implanted impurity is activated by conducting heat treatment of 1000° C. 20 seconds (FIG. 34F).

It is to be noted that while, in the above-mentioned process, the thermal oxide film is used as a stopper film in the solid phase diffusion, a deposited film such as a silicon oxide film or a silicon nitride film, etc. may be used in place of the thermal oxide film.

Further, while, in the above-mentioned process, by a high temperature and short time heat treatment of 1000° C. and 15 seconds, solid phase diffusion from the BSG side walls into the Si substrate in the P-channel FET region is carried out, solid phase diffusion of B from the BSG side walls into the Si substrate may be carried out by heat treatment of activation of the source/drain regions.

Furthermore, though in N channel region the oxide film 77 as a stopper for solid phase diffusion is formed in the above-mentioned processes, the oxide film 77 may not be formed as shown in FIGS. 36A–36F. This is because relatively shallow and high concentration diffusion layer can be formed using As ion implantation compared to B ion. Therefore, if As ion implantation is performed to form diffused region of much higher As concentraion than B concentraion from the BSG film, B ions diffused in solid phase is cancelled.

Hitherto, because the diffusion factor of boron is great, it was difficult to form a shallow diffused layer. However, in this embodiment, because the solid phase diffusion is used, it is possible to form a shallow diffused layer. In addition, since the solid phase diffusion is used only in connection with the P-channel FET, an increase of the number of steps is no problem.

It is to be noted that while, in this embodiment, the solid phase diffusion from BSG film is carried out on the P-channel side, there may be instead employed a method in which the solid phase diffusion from PSG, AsSG, etc. is carried out on the N-channel side, and diffusion by ion implantation is carried out on the P-channel side.

[Eighth Embodiment]

An eighth embodiment of this invention will now be described in detail with reference to FIGS. 35A to 35F.

This invention contemplates providing a shallow and high concentration impurity profile which was difficult in the prior art.

First, a device region 84 is formed by the LOCOS process on an n-type silicon substrate 71.

Then, the device region is oxidized to form a gate oxide film 85 so that its thickness is equal to 40 angstroms to form a boron doped polysilicon 86 thereon so that its thickness is equal to 200 angstroms.

Then, a resist 87 is coated on the entire surface to apply patterning thereto so that a pattern greater than the gate electrode is formed. The boron doped polysilicon 86 and the gate oxidize film 85 are etched with the resist pattern 87 being as a mask to remove the resist pattern.

Then, boron doped polysilicon film 86 is deposited on the entire surface of the silicon substrate 71 so that its thickness is 2000 angstroms.

Figure 35A:
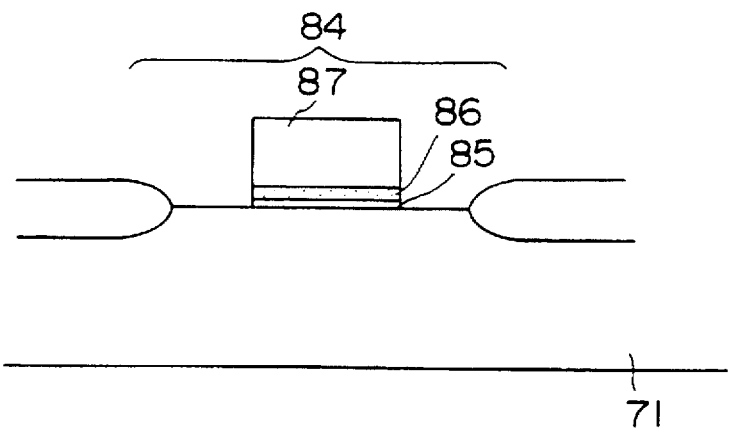
FIGS. 35A–35F are device cross sectional views of every process step showing a method of manufacturing a FET according to this invention.
Figure 35B:
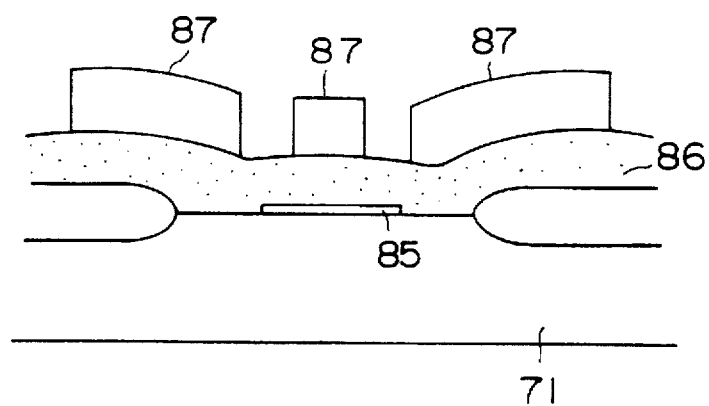

Subsequently, resist 78 is coated on the entire surface to form, by patterning, resist patterns 87 on a gate electrode formation region and source/drain lead-out electrode formation region (FIG. 35B).

Then, the boron doped polysilicon is etched with the resist pattern 87 being as a mask to form a gate electrode 88 and source/drain lead-out electrodes 89 to peel off the resist pattern 87.

Figure 35C:
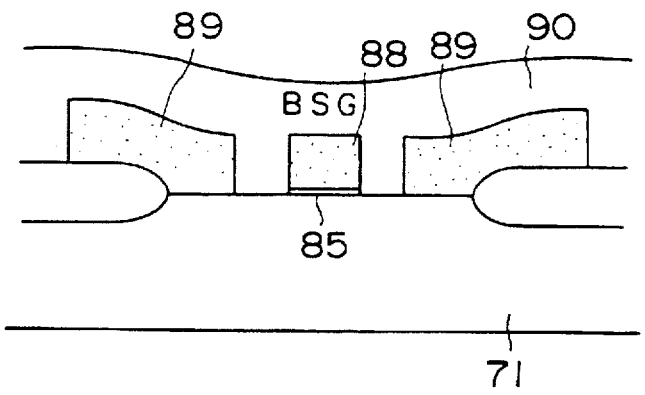

Subsequently, silicate glass (BSG) layers 90 including boron of high concentration are deposited on the entire surface so that its thickness is equal to 3000 angstroms (FIG. 35C).

Then, etch back process is implemented to the entire surface to thereby allow BSG 90 to be buried into grooves between the gate electrode 88 and the source/drain lead-out electrodes 89 to carry out heat treatment under condition of 1000° C. and 15 seconds to allow boron to be diffused from the BSG 90 and the boron doped polysilicon 89 into the source/drain regions.

At this time, since the diffusion rate of boron in the boron-doped polysilicon is higher than that in the BSG, shallow diffused layers 91 and deep diffused layers 92 are formed on the inside and on the outside, respectively.

Figure 35D:
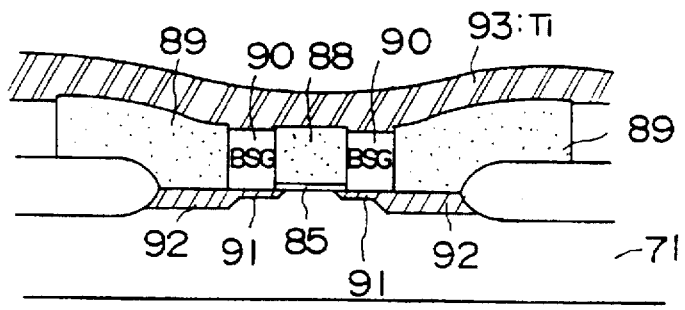

Then, a Ti 93 is deposited on the entire surface of the substrate so that its thickness is equal to 800 angstroms (FIG. 35D).

Then, a heat treatment of 800° C. is carried out to thereby allow the Ti 93 and the boron doped polysilicon 88, 89 to react with each other to form a Ti silicide 94. Subsequently, Ti which has not yet reacted is removed by a mixed solution of sulfuric acid and hydrogen peroxide solution.

Figure 35E:
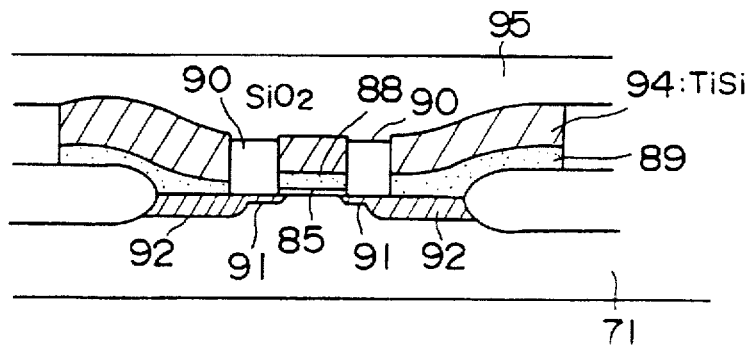

Then, a SiO$_2$ film 95 is deposited on the entire surface so that its thickness is equal to 5000 angstroms (FIG. 35E).

Figure 35F:
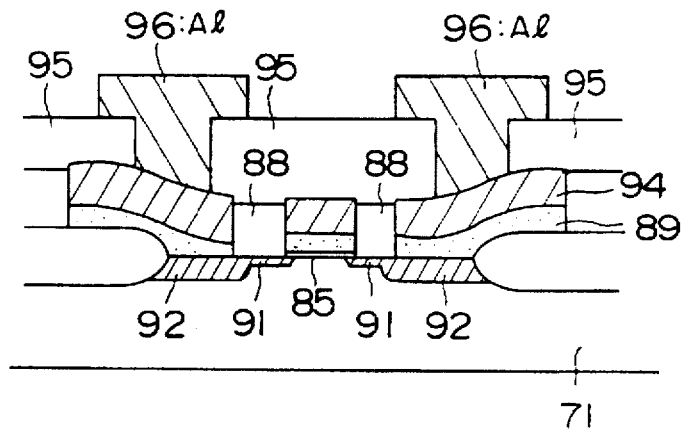
Figure 36A:
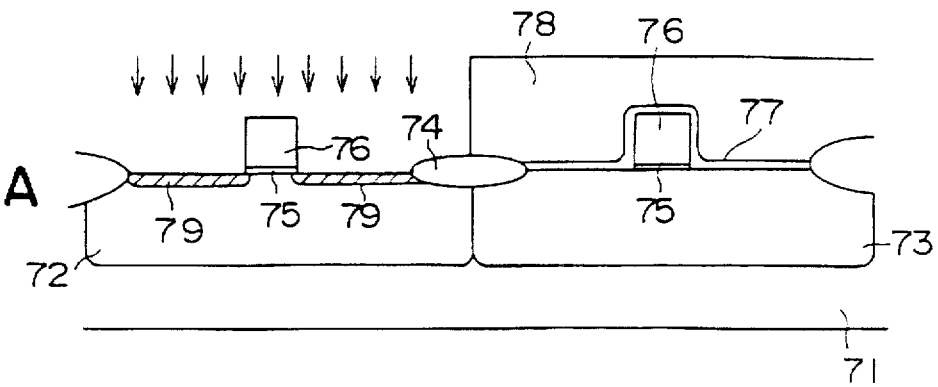
Figure 36B:
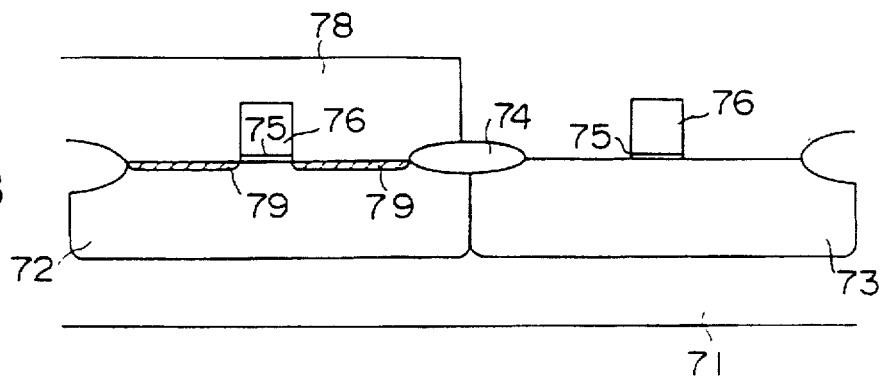
Figure 36C:
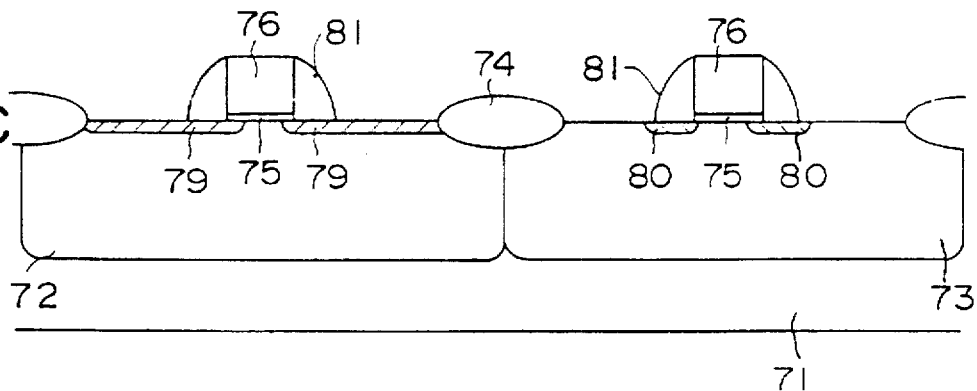

Finally, electrode lead-out contact holes are opened in the SiO$_2$ film 95 to form Al interconnections 96 (FIG. 35F).

As has been explained above, in accordance with this embodiment, by using solid phase diffusion from the gate side walls of a silicon glass including impurity of high concentration, very shallow source/drain diffused layers having high concentration can be formed. Thus, a miniaturized and high drivability MOSFET can be manufactured. In addition, in the manufacturing of CMOSFET, an approach is employed such that solid phase diffusion is used only for one MOSFET and a diffusion prevention layer of the solid phase diffusion is formed with respect to the type in which no solid phase diffusion is carried out, thereby making it possible to provide a miniaturized and high performance CMOSFETs without increasing the number of process steps.

As described in detail, in accordance with this invention, the source and the drain have a first diffused layer including impurity of a second conductivity type positioned on the field oxidize film side and a second diffused layer including the impurity of the second conductivity type positioned on the channel formation region in such a manner that they are relative to each other, and the second diffused layers on the both sides of the gate are formed shallow so that it has a high concentration. Thus, the parasitic resistance can be reduced while suppressing the short-channel effect in a miniaturized MOS device. Accordingly, it is possible to obtain a large drain current, and to set the first diffused layer deep to such an extent that the contact resistance is low, the leakage current is suppressed and resistance is low in carrying out formation of electrode by the salicide process into the first diffused layer.

What is claimed is:

1. A method of manufacturing a semiconductor device, comprising the steps of:

forming a device isolation region on a semiconductor substrate of a first conductivity type;

forming a gate electrode on said semiconductor substrate within a region surrounded by said device isolation region;

forming insulating film walls including a second conductivity type impurity on both sides of said gate electrode;

carrying out implantation and activation of impurity ions of the second conductivity type on the entire surface of said semiconductor substrate to form two first diffused layers which are to respectively serve as a source and a drain, and to allow impurity of the second conductivity type included in said insulating film side walls to be diffused into said semiconductor substrate to thereby form, on respective channel formation region sides of said first diffused layers within said semiconductor substrate, second diffused layers shallower than said first diffused layer and having a profile in which the concentration is more than $5 \times 10^{18}$ cm$^{-3}$ at the peak and is in correspondence with a carrier concentration of said semiconductor substrate at a depth less than 0.04 µm; and forming, by a self-align silicidation process, metal silicide films which are to respectively serve as a source region and a drain region, on the respective surface portions of said first diffused layers which are to respectively serve as said source region and said drain region.

2. A method of manufacturing a semiconductor device, comprising the steps of:

forming a first conductivity type well region and a second conductivity type well region surrounded by a device isolation region on a semiconductor substrate;

respectively forming gate electrodes on said semiconductor substrate over said first conductivity type well region and said second conductivity type well region;

forming first sidewall spacers comprised of silicate glass, in which impurities of both the first and second conductivity types are doped, on opposite sides of said gate electrodes;

allowing said impurities of said first and second conductivity types to be diffused from said first sidewall spacers into said substrate by heat treatment;

implanting said second conductivity type impurity and said first conductivity type impurity into said first conductivity type well region and into said second conductivity type well region, respectively;

peeling off said first sidewall spacers formed on the opposite sides of said gate electrode over said first conductivity type well region and then forming second sidewall spacers comprised of a silicon oxide film; and carrying out heat treatment to allow only said first conductivity type impurity of impurities diffused from said first sidewall spacers to be transferred to said second sidewall spacers.

3. A method of manufacturing a semiconductor device, which comprises the steps of:

forming a device isolation region on a semiconductor substrate of a first conductivity type;

forming a gate electrode on said semiconductor substrate within a region surrounded by said device isolation region;

forming insulating film side walls including a second conductivity type impurity on both sides of said gate electrode;

implanting impurity ions of the second conductivity type on portions of said gate electrode adjoining said insulating film side walls; and forming first diffused layers by activating impurity ions diffused in the semiconductor substrate, and forming second diffused layers by allowing impurity ions of the second conductivity type included in said insulating film side walls into said semiconductor substrate, on respective channel formation region sides of said first diffused layers, said second diffused layers being shallower than said first diffused layers and having an ion concentration that is higher than that of the first diffused layers.

4. The method of manufacturing a semiconductor device according to claim 3, wherein the method further comprises a step of silicifying a surface of the first diffused layers to form a metal silicide film.

5. The method of manufacturing a semiconductor device according to claim 4, wherein said metal silicide film is formed by a self-aligned process.

6. The method of manufacturing a semiconductor device according to claim 3, wherein said step of forming second diffused layers provides a profile in which the ion concentration of the second diffused layers is more than $5 \times 10^{18}$ cm$^{-3}$ at its peak and is in correspondence with an ion concentration of said semiconductor substrate at a depth less than 0.04 µm.

7. The method of manufacturing a semiconductor device according to claim 4, wherein the step of forming first diffused layers forms two separate layers, and wherein said two separate layers respectively serve as a source and a drain.

8. The method of manufacturing a semiconductor device according to claim 7, wherein a first part of said metal silicide film serves as a source electrode, and a second part of said metal silicide film separate from said first part serves as a drain region.

* * * * *